United States Patent
Ozawa

(10) Patent No.: US 8,036,398 B2
(45) Date of Patent: Oct. 11, 2011

(54) CIRCUIT AND APPARATUS HAVING A DELAY UNIT FOR REDUCING PERIODIC NOISE

(75) Inventor: Kazuhiko Ozawa, Kanagawa (JP)

(73) Assignee: Sony Corporation (JP)

( * ) Notice: Subject to any disclaimer, the term of this patent is extended or adjusted under 35 U.S.C. 154(b) by 1170 days.

(21) Appl. No.: 11/440,261

(22) Filed: May 23, 2006

(65) Prior Publication Data

US 2006/0269252 A1    Nov. 30, 2006

(30) Foreign Application Priority Data

May 27, 2005    (JP) .................................. 2005-155359

(51) Int. Cl.
*H04B 15/00*    (2006.01)

(52) U.S. Cl. ........ 381/94.1; 381/83; 381/93; 381/71.11; 381/71.12

(58) Field of Classification Search ................ 381/71.2, 381/460, 71.11, 94.1, 94.2, 94.5, 94.7, 94.8, 381/98, 101, 95, 92, 122, 123, 81, 85, 71.8, 381/71.13; 318/460, 71.13, 71.8; 700/94, 700/66, 93, 83

See application file for complete search history.

(56) References Cited

U.S. PATENT DOCUMENTS

| | | | | |
|---|---|---|---|---|
| 5,426,433 A * | 6/1995 | Gertel | ............................. | 342/15 |
| 5,586,064 A | 12/1996 | Grupp | | |
| 5,768,166 A | 6/1998 | Palatnik | | |
| 5,894,459 A * | 4/1999 | Kurita et al. | ............... | 369/13.02 |
| 6,611,602 B1 | 8/2003 | White et al. | | |
| 2004/0032509 A1* | 2/2004 | Owens et al. | ............... | 348/222.1 |
| 2005/0063553 A1* | 3/2005 | Ozawa | ............................ | 381/92 |

FOREIGN PATENT DOCUMENTS

| | | |
|---|---|---|
| EP | 1124218 A1 * | 8/2001 |
| JP | 62-271203 A | 11/1987 |
| JP | 64-081518 A | 3/1989 |
| JP | 02-223062 A | 9/1990 |
| JP | 04-249913 A | 9/1992 |
| JP | 06-349208 A | 12/1994 |
| JP | 3277435 A | 3/1996 |
| JP | 11-176113 A | 7/1999 |
| JP | 11-205891 A | 7/1999 |
| JP | 11-306699 A | 11/1999 |
| JP | 11-328884 A | 11/1999 |

(Continued)

OTHER PUBLICATIONS

Office Action from Taiwan Application No. 95116422, dated May 7, 2009.

*Primary Examiner* — Vivian Chin
*Assistant Examiner* — Leshui Zhang
(74) *Attorney, Agent, or Firm* — Lerner, David, Littenberg, Krumholz & Mentlik, LLP

(57) ABSTRACT

A signal processing circuit includes a delaying unit that is configured to carry out delay processing on the basis of periodicity information synchronized with the periodicity of a periodic noise included in an input signal and a filter unit that is configured to receive the input signal and has a notch characteristic at a frequency f. The frequency f satisfies $f=N/T$, where N represents an integer equal to or greater than one and T represents a delaying time applied by the delaying unit.

9 Claims, 14 Drawing Sheets

FOREIGN PATENT DOCUMENTS

| | | | |
|---|---|---|---|
| JP | 11325168 A | * | 11/1999 |
| JP | 2000-293806 A | | 10/2000 |
| JP | 2001-250202 A | | 9/2001 |
| JP | 2001-319420 A | | 11/2001 |
| JP | 2003-338122 A | | 11/2003 |
| JP | 2003338122 A | * | 11/2003 |
| JP | 2004-71076 A | | 3/2004 |
| JP | 2004-095130 A | | 3/2004 |
| JP | 2004-192666 A | | 7/2004 |
| WO | WO 2004015709 A1 | * | 2/2004 |

* cited by examiner

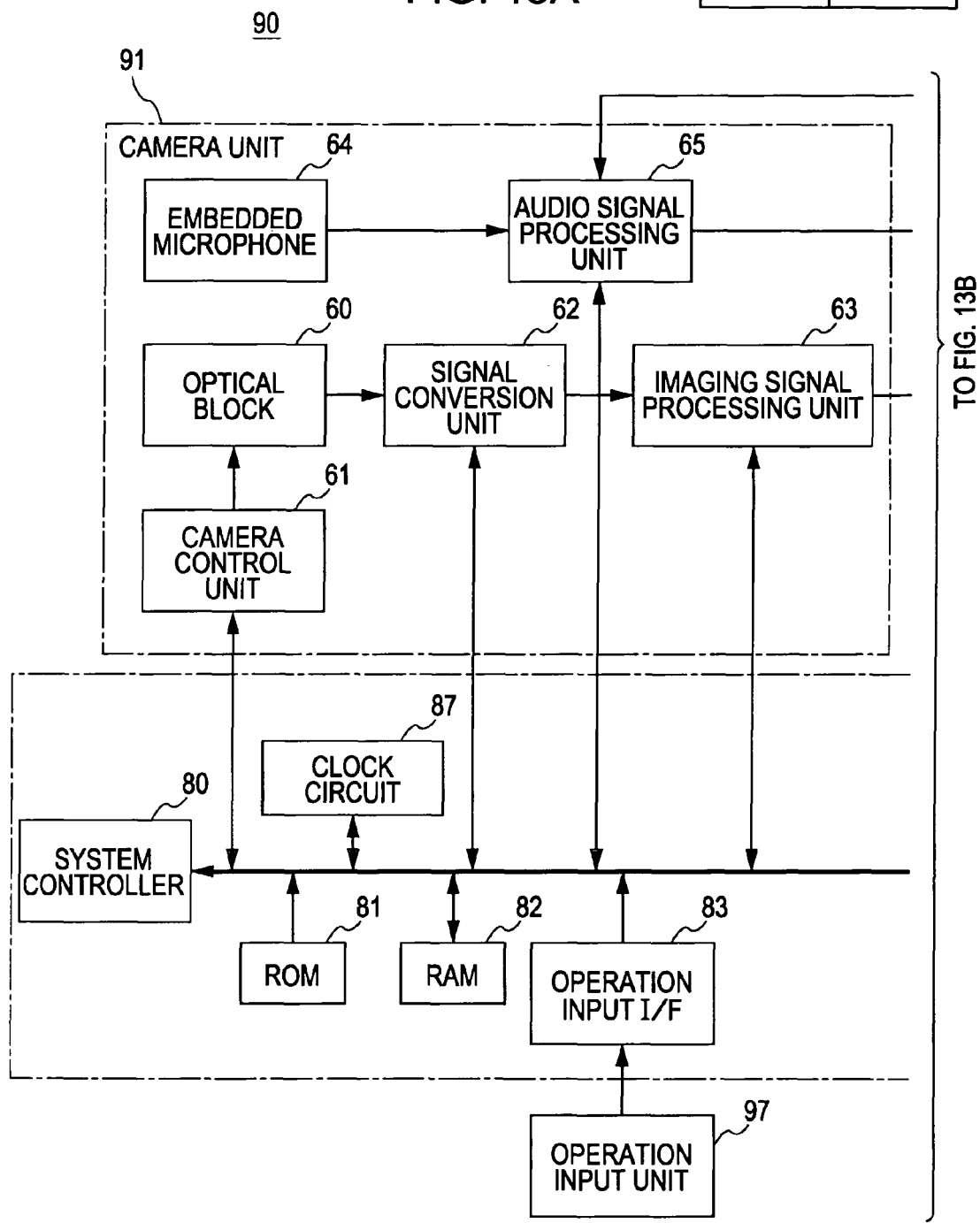

CIRCUIT AND APPARATUS HAVING A DELAY UNIT FOR REDUCING PERIODIC NOISE

CROSS-REFERENCE TO RELATED APPLICATIONS

The present application claims priority from Japanese Patent Application No. JP 2005-155359 filed on May 27, 2005, the disclosure of which is hereby incorporated by reference herein.

BACKGROUND OF THE INVENTION

The present invention relates to a signal processing circuit, a method of processing a signal, an audio signal processing circuit, an imaging apparatus, a method of processing an audio signal with an imaging apparatus, a recording apparatus, a method of recording, a playing apparatus, and a method of playing, all capable of reducing periodic noise having a variable period and/or noise level.

An imaging apparatus, such as a portable video camera, generates various noises while capturing an image. An example of a noise generated inside the imaging apparatus is a periodic noise generated at a predetermined period at a frequency of about 150 Hz caused by, for example, the rotation of a rotary drum in case where the recording medium is a magnetic tape.

When a microphone included in the imaging apparatus picks up sound and records the sound on a recording medium, in addition to the target sound, noise generated inside the imaging apparatus is picked up, reducing the quality of the recorded sound. Japanese Unexamined Patent Application Publication No. 11-176113 describes a technology for reducing periodic noise by using a synchronous adaptive filter that is configured to adaptively change the filter coefficient in response to the periodic noise.

SUMMARY OF THE INVENTION

An optical disk, such as a digital versatile disk (DVD), or a magnetic disk, such as a hard disk driver (HDD), may be loaded on an imaging apparatus as a recording medium. When such an optical disk or a magnetic disk is used as a recording medium, the recording medium is rotated by rotating a spindle motor. Therefore, similar to a case in which magnetic tape is used as a recording medium, periodic noise is generated.

However, when magnetic tape is used as a recording medium, the number of rotations of a drum motor used for rotating the magnetic tape is constant and specified by the recording format. In contrast, when an optical disk, such as a DVD, is used as a recording medium, a constant linear velocity (CLV) control method is used in general for writing in data, and, depending on the writing position, the rotational frequency of the spindle motor differs. As a result, the periodicity of the generated periodic noise changes. In other words, when the CLV control method is employed, the rotational speed of the optical disk is fast at the inner circumference and slow at the outer circumference. Consequently, the periodic noise is generated in a shorter period at the inner circumference, whereas the periodic noise is generated in a longer period at the outer circumference.

When a magnetic disk, such as a HDD, is used as a recording medium, for example, to record images and sound, the quality of the image and sound can be selected by selecting a standard definition (SD) signal or a high definition (HD) signal. Depending on the selected quality of the image and sound, the bit rate of the data written in and read out changes. In this case, the rotational frequency of the spindle motor changes in accordance with the bit rate of the data written in, the periodicity of the generated periodic noise changes.

When data is not being written in an optical disk or a magnetic disk, the apparatus may enter an idling mode in which the number of rotations of the disk is reduced to reduce electric power consumption. In this way, when the mode is changed from, for example, from a writing mode to an idling mode, the rotational frequency of the spindle motor changes. Thus, the periodicity of the generated periodic noise changes.

In this way, when the periodicity of the generated periodic noise changes because of a change in the rotational frequency of the spindle motor, the above-described synchronous adaptive filter requires, for example, several seconds to converge since the synchronous adaptive filter is an error feedback type filter. As a result, noise reduction may take too much time or the periodic noise may be reduced because the periodic change of the periodic noise cannot be tracked.

Accordingly, embodiments of the present invention provided a signal processing circuit, a method of processing a signal, an audio signal processing circuit, a method of processing an audio signal, an imaging apparatus, a method of processing an audio signal with an imaging apparatus, a recording apparatus, a method of recording, a playing apparatus, and a method of playing, all capable of reducing periodic noise in response to a change in the periodicity of the periodic noise.

To solve the above-identified problems, an embodiment of the present invention provides a signal processing circuit including a delaying unit that is configured to carry out delay processing on the basis of periodicity information synchronized with the periodicity of a periodic noise included in an input signal and a filter unit that is configured to receive the input signal and has a notch characteristic at a frequency f. The frequency f satisfies f=N/T, where N represents an integer equal to or greater than one and T represents a delaying time applied by the delaying unit.

Another embodiment of the present invention provides a method of processing a signal including the steps of filtering an input signal with a filter having a notch characteristic at a frequency f and outputting the filtered signal. The frequency f satisfies f=N/T, where N represents an integer equal to or greater than one and T represents a delaying time applied by delay processing performed on the basis of periodicity information synchronized with the periodicity of a periodic noise included in the input signal.

Another embodiment of the present invention provides a signal processing circuit including a first filter, a second filter, and a switching unit configured to switch between outputting a first output from the first filter and a second output from the second filter and to output either the first output or the second output. The first filter includes a delaying unit that is configured to carry out delay processing on the basis of periodicity information synchronized with the periodicity of a periodic noise included in an input signal and a filter unit that is configured to receive the input signal and has a notch characteristic at a frequency f. The frequency f satisfies f=N/T, where N represents an integer equal to or greater than one and T represents a delaying time applied by the delaying unit. The second filter includes an adaptive filter unit configured to output a pseudo noise signal approximating the periodic noise on the basis of the periodicity information and a subtraction unit configured to subtract the pseudo noise signal from the input signal.

Another embodiment of the present invention provides a method of processing a signal including the steps of switching between outputting a first output and a second output and outputting either the first output or the second output. The first output is obtained by filtering an input signal with a filter having a notch characteristic at a frequency f. The frequency f satisfies f=N/T, where N represents an integer equal to or greater than one and T represents a delaying time applied by delay processing performed on the basis of periodicity information synchronized with the periodicity of a periodic noise included in the input signal. The second output is obtained by subtracting a pseudo noise signal approximating the periodic noise from the input signal. The pseudo noise signal is obtained at an adaptive filter on the basis of the periodicity information.

Another embodiment of the present invention provides an audio signal processing circuit including a delaying unit that is configured to carry out delay processing on the basis of periodicity information synchronized with the periodicity of a periodic noise included in an input audio signal and a filter unit that is configured to receive the audio signal and has a notch characteristic at a frequency f. The frequency f satisfies f=N/T, where N represents an integer equal to or greater than one and T represents a delaying time applied by the delaying unit.

Another embodiment of the present invention provides a method of processing an audio signal including the steps of filtering an input audio signal with a filter having a notch characteristic at a frequency f and outputting the filtered audio signal. The frequency f satisfies f=N/T, where N represents an integer equal to or greater than one and T represents a delaying time applied by delay processing performed on the basis of periodicity information synchronized with the periodicity of a periodic noise included in the audio signal.

Another embodiment of the present invention provides an audio signal processing circuit including a first filter, a second filter, and a switching unit configured to switch between outputting a first output of the first filter and a second output of the second filter and to output either the first output or the second output. The first filter includes a delaying unit that is configured to carry out delay processing on the basis of periodicity information synchronized with the periodicity of a periodic noise included in an input audio signal and a filter unit that is configured to receive the audio signal and has a notch characteristic at a frequency f. The frequency f satisfies f=N/T, where N represents an integer equal to or greater than one and T represents a delaying time applied by the delaying unit. The second filter includes an adaptive filter unit configured to output a pseudo noise signal approximating the periodic noise on the basis of the periodicity information and a subtraction unit configured to subtract the pseudo noise signal from the audio signal.

Another embodiment of the present invention provides a method of processing an audio signal includes the steps of switching between outputting a first output and a second output and outputting either the first output or the second output. The first output is obtained by filtering an input audio signal with a filter having a notch characteristic at a frequency f. The frequency f satisfies f=N/T, where N represents an integer equal to or greater than one and T represents a delaying time applied by delay processing performed on the basis of periodicity information synchronized with the periodicity of a periodic noise included in the audio signal. The second output is obtained by subtracting a pseudo noise signal approximating the periodic noise from the audio signal. The pseudo noise signal is obtained at an adaptive filter on the basis of the periodicity information.

Another embodiment of the present invention provides an imaging apparatus including an imaging unit configured to capture light from an object and to output an image signal, an audio pick-up unit configured to pick up sound and output an audio signal, an audio signal processing unit configured to carry out signal processing on an audio signal output from the audio pick-up unit, and a recording unit having a rotary mechanism and being capable of recording an image signal output from the imaging unit and an audio signal output from the audio signal processing unit onto a recording medium. The audio signal processing unit includes a first filter, a second filter, and a switching unit configured to switch between outputting a first output from the first filter and a second output from the second filter and to output either the first output or the second output. The first filter includes a delaying unit that is configured to carry out delay processing on the basis of periodicity information synchronized with the periodicity of a periodic noise included in the audio signal and a filter unit that is configured to receive the audio signal and has a notch characteristic at a frequency f. The frequency f satisfies f=N/T, where N represents an integer equal to or greater than one and T represents a delaying time applied by the delaying unit. The second filter includes an adaptive filter unit configured to output a pseudo noise signal approximating the periodic noise on the basis of the periodicity information and a subtraction unit configured to subtract the pseudo noise signal from the audio signal.

Another embodiment of the present invention provides a method of processing an audio signal for an imaging apparatus includes the steps of capturing light reflected from an object at an imaging unit and outputting an image signal, picking up sound at an audio pick-up unit and outputting an audio signal, carrying out signal processing on an audio signal output in the step of picking up sound, and recording an image signal output in the step of capturing light and an audio signal output in the step of carrying out signal processing onto a recording medium at a recording unit having a rotary mechanism. The step of carrying out signal processing includes the steps of switching between outputting a first output and a second output and outputting either the first output or the second output. The first output is obtained by filtering the audio signal with a filter having a notch characteristic at a frequency f. The frequency f satisfies f=N/T, where N represents an integer equal to or greater than one and T represents a delaying time applied by delay processing performed on the basis of periodicity information synchronized with the periodicity of a periodic noise included in the audio signal. The second output is obtained by subtracting a pseudo noise signal approximating the periodic noise from the audio signal. The pseudo noise signal is obtained at an adaptive filter on the basis of the periodicity information.

Another embodiment of the present invention provides a recording apparatus includes an audio pick-up unit configured to pick up sound and output an audio signal, an audio signal processing unit configured to carry out signal processing on an audio signal output from the audio pick-up unit, and a recording unit having a rotary mechanism and being capable of recording an audio signal output from the audio signal processing unit. The audio signal processing unit includes a first filter, a second filter, and a switching unit configured to switch between outputting a first output from the first filter and a second output from the second filter and to output either the first output or the second output. The first filter includes a delaying unit that is configured to carry out delay processing on the basis of periodicity information synchronized with the periodicity of a periodic noise included in the audio signal and a filter unit that is configured to receive the audio signal and has a notch characteristic at a frequency f. The frequency f satisfies f=N/T, where N represents an integer equal to or greater than one and T represents a delaying time applied by the delaying unit. The second filter includes an adaptive filter unit configured to output a pseudo noise signal approximating the periodic noise on the basis of the periodicity information and a subtraction unit configured to subtract the pseudo noise signal from the audio signal.

Another embodiment of the present invention provides a method of recording includes the steps of picking up sound and outputting an audio signal, carrying out signal processing on an audio signal output in the step of picking up sound, and recording an audio signal output in the step of carrying out signal processing onto a recording medium at a recording unit having a rotary mechanism. The step of carrying out signal processing includes the steps of switching between outputting a first output and a second output and outputting either the first output or the second output. The first output is obtained by filtering the audio signal with a filter having a notch characteristic at a frequency f. The frequency f satisfies f=N/T, where N represents an integer equal to or greater than one and T represents a delaying time applied by delay processing performed on the basis of periodicity information synchronized with the periodicity of a periodic noise included in the audio signal. The second output is obtained by subtracting a pseudo noise signal approximating the periodic noise from the audio signal. The pseudo noise signal is obtained at an adaptive filter on the basis of the periodicity information.

Another embodiment of the present invention provides a playing apparatus includes a playing unit configured to play an audio signal, the playing unit including a rotary mechanism, an audio signal processing unit configured to carry out signal processing on an audio signal output from the playing unit, and an audio output unit configured to output an audio signal output from the signal processing unit. The audio signal processing unit includes a first filter, a second filter, and a switching unit configured to switch between outputting a first output from the first filter and a second output from the second filter and to output either the first output or the second output. The first filter includes a delaying unit that is configured to carry out delay processing on the basis of periodicity information synchronized with the periodicity of a periodic noise included in the audio signal and a filter unit that is configured to receive the audio signal and has a notch characteristic at a frequency f. The frequency f satisfies f=N/T, where N represents an integer equal to or greater than one and T represents a delaying time applied by the delaying unit. The second filter includes an adaptive filter unit that is configured to output a pseudo noise signal approximating the periodic noise on the basis of the periodicity information and a subtraction unit that is configured to subtract the pseudo noise signal from the audio signal.

Another embodiment of the present invention provides a method of playing includes the steps of playing an audio signal at a playing unit including a rotary mechanism, carrying out signal processing on an audio signal output in the step of playing an audio signal, and outputting an audio signal output in the step of carrying out signal processing. The step of carrying out signal processing includes the steps of switching between outputting a first output and a second output and outputting either the first output or the second output. The first output is obtained by filtering the audio signal with a filter having a notch characteristic at a frequency f. The frequency f satisfies f=N/T, where N represents an integer equal to or greater than one and T represents a delaying time applied by delay processing performed on the basis of periodicity information synchronized with the periodicity of a periodic noise included in the audio signal. The second output is obtained by subtracting a pseudo noise signal approximating the periodic noise from the audio signal. The pseudo noise signal is obtained at an adaptive filter on the basis of the periodicity information.

As described above, according to embodiments of the present invention, a periodic noise included in an input signal can be reduced in synchronization with the periodicity of the periodic noise since the input signal is output after being filtered at a filter having a notch characteristic at a frequency f that satisfies f=N/T, where N represents an integer equal to or greater than one and T represents a delaying time applied by the delaying unit.

As described above, according to embodiments of the present invention, satisfactory periodic noise reduction processing can be carried out even when the periodicity and the noise level of a periodic noise changes since outputting of a first output and a second output is switched. Here, the first output is obtained by filtering an input signal with a filter having a notch characteristic at a frequency f. The frequency f satisfies f=N/T, where N represents an integer equal to or greater than one and T represents a delaying time applied by delay processing performed on the basis of periodicity information synchronized with the periodicity of a periodic noise included in the signal. The second output is obtained by subtracting a pseudo noise signal approximating the periodic noise from the signal. The pseudo noise signal is obtained at an adaptive filter on the basis of the periodicity information.

As described above, according to embodiments of the present invention, the periodic noise included in an input audio signal can be reduced in synchronization with the periodicity of a periodic noise since the audio signal is output after being filtered at a filter having a notch characteristic at a frequency f that satisfies f=N/T, where N represents an integer equal to or greater than one and T represents a delaying time applied by the delaying unit.

As described above, according to embodiments of the present invention, satisfactory periodic noise reduction processing can be carried out even when the periodicity and the noise level of a periodic noise changes since outputting of a first output and a second output is switched. Here, the first output is obtained by filtering an audio signal with a filter having a notch characteristic at a frequency f. The frequency f satisfies f=N/T, where N represents an integer equal to or greater than one and T represents a delaying time applied by delay processing performed on the basis of periodicity information synchronized with the periodicity of a periodic noise included in the audio signal. The second output is obtained by subtracting a pseudo noise signal approximating the periodic noise from the audio signal. The pseudo noise signal is obtained at an adaptive filter on the basis of the periodicity information.

As described above, according to embodiments of the present invention, an audio signal with a reduced periodic noise, which is generated from a rotary mechanism and has a variable periodicity and/or a noise level, can be recorded since an image signal is output by capturing light reflected from an object at an imaging unit, an audio signal is output by picking up sound at an audio pick-up unit, the image signal and the audio signal are recorded onto a recording medium at a recording unit having a rotary mechanism, and outputting of a first output and a second output is switched. Here, the first output is obtained by filtering the audio signal with a filter having a notch characteristic at a frequency f. The frequency f satisfies f=N/T, where N represents an integer equal to or greater than one and T represents a delaying time applied by delay processing performed on the basis of periodicity information synchronized with the periodicity of a periodic noise included in the audio signal. The second output is obtained by subtracting a pseudo noise signal approximating the periodic noise from the audio signal. The pseudo noise signal is obtained at an adaptive filter on the basis of the periodicity information.

As described above, according to embodiments of the present invention, an audio signal with a reduced periodic noise, which is generated from a rotary mechanism and has a variable periodicity and/or a noise level, can be recorded since an audio signal is output by picking up sound at an audio pick-up unit, the audio signal is recorded onto a recording medium at a recording unit having a rotary mechanism, and outputting of a first output and a second output is switched. Here, the first output is obtained by filtering the audio signal with a filter having a notch characteristic at a frequency f. The frequency f satisfies f=N/T, where N represents an integer equal to or greater than one and T represents a delaying time applied by delay processing performed on the basis of periodicity information synchronized with the periodicity of a periodic noise included in the audio signal. The second output is obtained by subtracting a pseudo noise signal approximating the periodic noise from the audio signal. The pseudo noise signal is obtained at an adaptive filter on the basis of the periodicity information.

As described above, according to embodiments of the present invention, an audio signal with a reduced periodic noise, which is generated from a rotary mechanism and has a variable periodicity and/or a noise level, can be played since an audio signal is played at a playing unit having a rotary mechanism and output after signal processing is carried out and outputting of a first output and a second output is switched. Here, the first output is obtained by filtering the audio signal with a filter having a notch characteristic at a frequency f. The frequency f satisfies f=N/T, where N represents an integer equal to or greater than one and T represents a delaying time applied by delay processing performed on the basis of periodicity information synchronized with the periodicity of a periodic noise included in the audio signal. The second output is obtained by subtracting a pseudo noise signal approximating the periodic noise from the audio signal. The pseudo noise signal is obtained at an adaptive filter on the basis of the periodicity information.

According to an embodiment of the present invention, since the notch characteristic of a frequency adaptive comb filter is changed on the basis of periodicity information synchronized with the periodicity of a periodic noise, the periodic noise can be reduced in synchronization with the periodicity of the periodic noise when the periodicity of the periodic noise changes.

According to an embodiment of the present invention, since the periodic noise reduced by switching a synchronous adaptive filter and a frequency adaptive comb filter at a predetermined timing, satisfactory periodic noise reduction processing can be carried out at any time.

DETAILED DESCRIPTION

A first embodiment of the present invention will be described below. According to the first embodiment of the present invention, the periodic noise included in an audio signal is reduced by using a comb filter having a notch characteristic at frequencies that are integral multiples of a predetermined frequency. At this time, the notch frequency is variable to correspond to the change in the periodicity of the periodic noise. Below, a case in which the input signal is an audio signal will be described.

Figure 1:
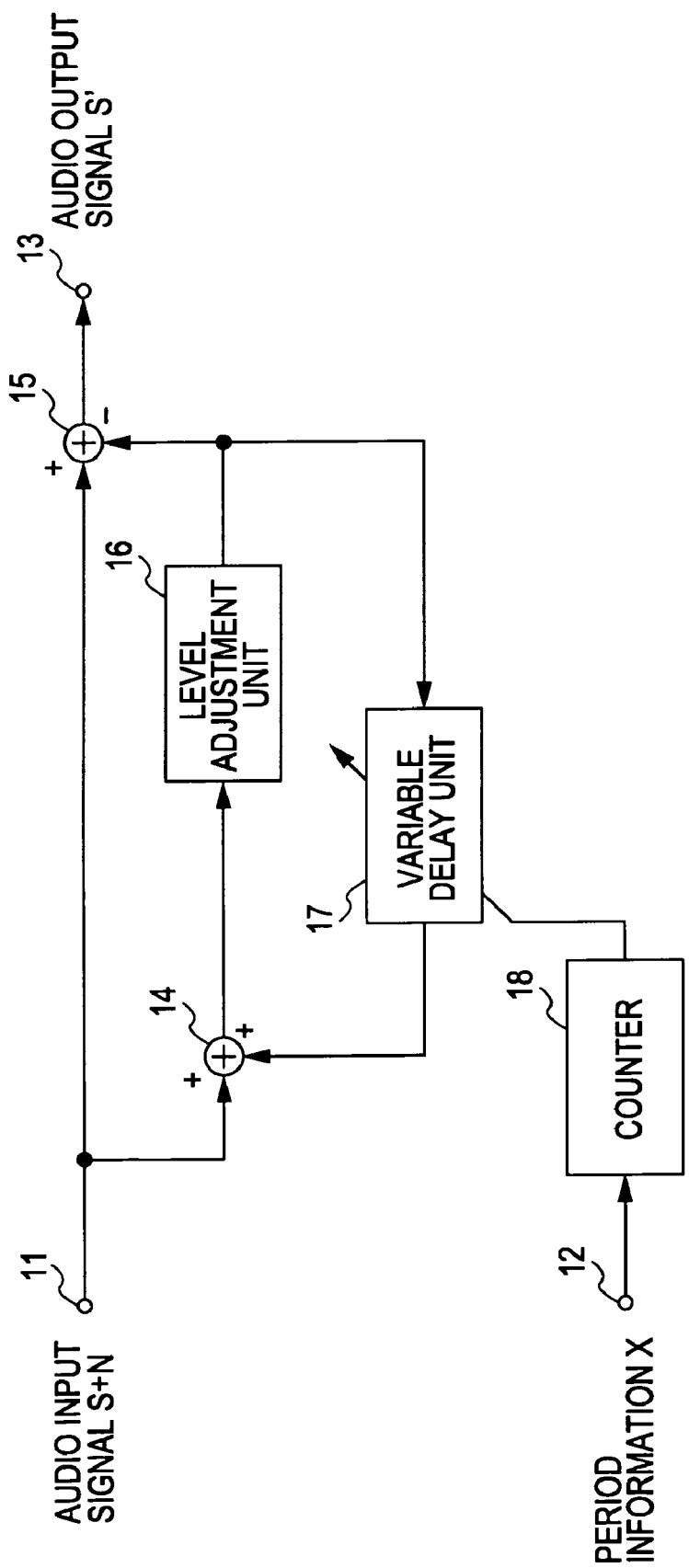
FIG. 1 illustrates a block diagram of an example configuration of a frequency adaptive comb filter according to a first embodiment of the present invention.

FIG. 1 illustrates an example configuration of a frequency adaptive comb filter 10. An audio input signal S+N that is a combination of a periodic noise N and an audio signal S is input to an input terminal 11. The audio input signal S+N is a digital audio signal quantized by a predetermined quantizing bit number and is sampled by, for example, pulse code modulation (PCM) at a predetermined sampling frequency.

The audio input signal S+N input to the input terminal 11 is supplied to an adder 14 and to the adding terming of an adder 15. The adder 14 adds the audio input signal S+N and a signal supplied from a variable delay unit 17 and then supplies the signal obtained by the addition to a level adjustment unit 16. The level adjustment unit 16 adjusts the level of the signal supplied from the adder 14 to a predetermined level and supplies the adjusted signal to the subtracting terminal of the adder 15 and the variable delay unit 17 capable of changing the amount of delay. The adder 15 supplies an audio output signal S' to an output terminal 13, wherein the audio output signal S' is obtained by subtracting the output signal from the level adjustment unit 16 from the audio input signal S+N.

Periodicity information X synchronized with the periodicity of the periodic noise N is input to an input terminal 12 and is supplied to a counter 18. The counter 18 converts the input periodicity information X into delay information and supplies the delay information to the variable delay unit 17. The variable delay unit 17 delays the signal supplied from the level adjustment unit 16 by a predetermined amount of time on the basis of the delay information sent from the counter 18.

Figure 2:
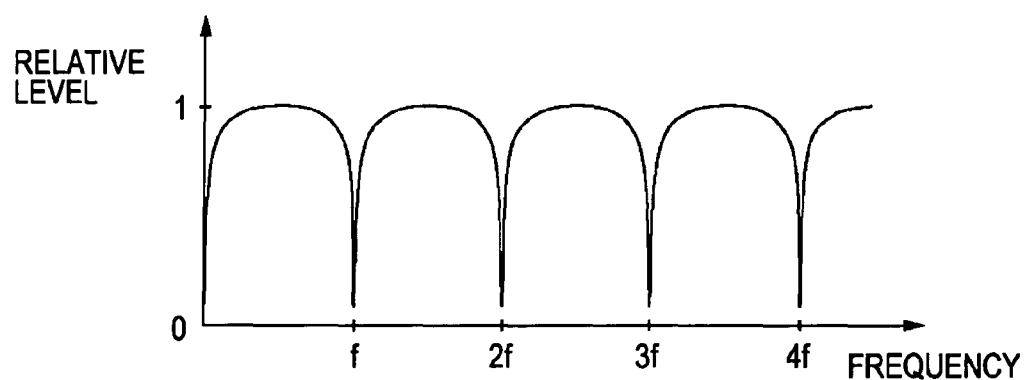
FIG. 2 illustrates a schematic view of the frequency characteristics of the frequency adaptive comb filter.

FIG. 2 illustrates the frequency characteristics of the above-described frequency adaptive comb filter 10. The frequency adaptive comb filter 10, shown in FIG. 1, is a comb filter having a notch characteristic in which frequency components that are integral multiples of a predetermined frequency f are damped. The relationship between the frequency f and delay time T at the variable delay unit 17 is represented by the following formula:

$$f = 1/T \qquad (1)$$

The frequency adaptive comb filter 10 can change the notch characteristic of all frequency components that are integral multiples of the predetermined frequency f by changing the delay time T. More specifically, the delay time T of the variable delay unit 17 is changed on the basis of the periodicity information X synchronized with the periodicity of the periodic noise N to adaptively change the notch characteristic in accordance with the frequency characteristic of the periodic noise. In this way, a comb filter capable of tracking the periodicity of the periodic noise N can be provided.

The periodicity information X is, for example, a pulsed signal output in synchronization with the periodicity of the periodic noise N. For example, a rotation control signal that is sent from a spindle motor driver configured to control a spindle motor can be used as the periodicity information X if the frequency adaptive comb filter 10 is included in an imaging apparatus that uses a disk type recording medium, such as an optical disk, and if the periodic noise N is generated by the rotation of the spindle motor.

Figure 3:
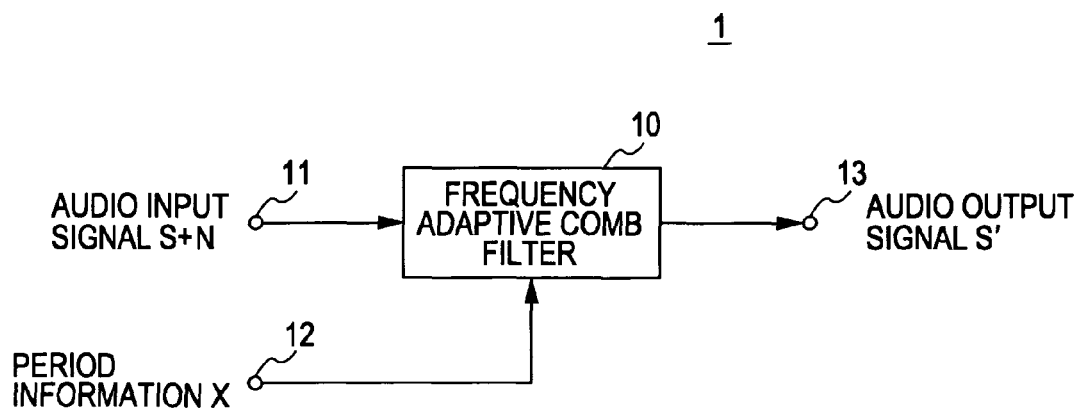
FIG. 3 illustrates a block diagram of an example configuration of a periodic noise reduction circuit using the frequency adaptive comb filter according to the first embodiment of the present invention.

FIG. 3 illustrates an example configuration of a periodic noise reduction circuit 1 including the frequency adaptive comb filter 10 according to the first embodiment of the present invention. As shown in FIG. 3, by independently using the frequency adaptive comb filter 10 according to the first embodiment, the periodic noise can be reduced in the same manner as that of a known synchronous adaptive filter.

The frequency adaptive comb filter 10 does not only damp the frequency components of the frequency f of the input signal but also damps some of the frequency components in the vicinity of the frequency f. For example, when the audio input signal S+N is input to the frequency adaptive comb filter 10, not only the periodic noise N is damped but also frequency components in the vicinity of frequency f included in the main audio signal S are damped. This problem can be solved by significantly increasing steepness of the slope of the notch characteristic so that only the periodic noise N is reduced without damping the main audio signal S as much as possible. When a fluctuation in the frequency f due to a minute fluctuation in the periodicity in a period jitter and so on of the rotary mechanism occurs, generally, the notch characteristic should including a wide range of frequencies that covers the fluctuation of the frequency f. However, such as the frequency adaptive comb filter 10 according to this embodiment, if the filter is adaptive to frequency, the fluctuation of the frequency can be tracked and the notch characteristic can be maintained at a significantly steep slope. Accordingly, the frequency components in the vicinity of the frequency f are damped by smaller amounts, and the main audio signal S is less affected.

For example, the periodicity of the rotation of a disk may change due to a change in the periodicity of the rotation of a spindle motor. Consequently, in response to the change, the noise level of the generated periodic noise N may also change. Since the frequency adaptive comb filter 10 according to the first embodiment determines the notch characteristic on the basis of the periodicity of the periodic noise N and damps predetermined frequency components, even if the noise level of the periodic noise N fluctuates, the reduction in the periodic noise N is almost not affected. Accordingly, even in a case in which the noise level of the periodic noise N fluctuates, the frequency adaptive comb filter 10 can be used.

Next, a periodic noise reduction circuit according to a second embodiment of the present invention will be described. The periodic noise reduction circuit according to the second embodiment includes both the frequency adaptive comb filter according to the first embodiment and a known synchronous adaptive filter and, when required, switches between the two different filters to efficiently reduce a periodic noise.

Figure 4:
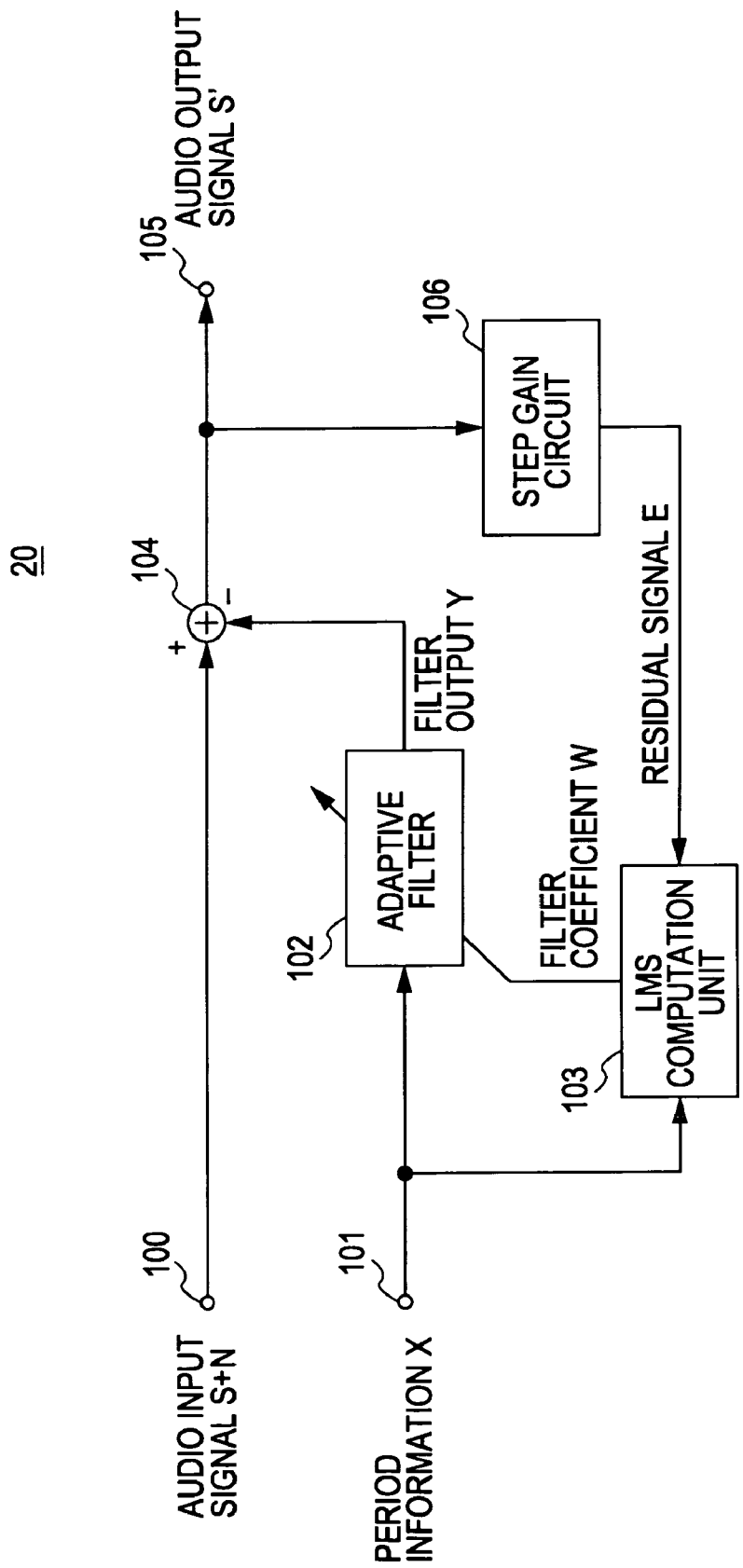
FIG. 4 illustrates a block diagram of an example configuration of a synchronous adaptive filter.

First, an overview of the periodic noise reduction circuit using a synchronous adaptive filter will be described below with reference to FIG. 4. A microphone picks up an audio input signal S+N that is a combination of a main audio signal S, which is the target sound of the pick up, and a periodic noise N. The audio input signal S+N is a digital audio signal quantized by a predetermined quantizing bit number and is sampled by, for example, PCM at a predetermined sampling frequency.

The picked up audio input signal S+N is input from an input terminal 100 to the adding terminal of an adder 104. The adder 104 substrates a filter output Y sent from an adaptive filter 102, described below, from the audio input signal S+N sent from the input terminal 100 to obtain an audio output signal S'. The obtained audio output signal S' is output from an output terminal 105.

The audio output signal S' is supplied to a step gain circuit 106. The step gain circuit 106 sends a residual signal E obtained by multiplying the supplied audio output signal S' by a predetermined gain coefficient to a least mean square (LMS) computation unit 103.

At the same time, the periodicity information X synchronized with the periodicity of the periodic noise N is input from an input terminal 101 to the adaptive filter 102 and the LMS computation unit 103. The periodicity information X is, for example, a rotation control signal of a spindle motor sent from a spindle motor driver that is configured to control the spindle motor (not shown in the drawing). Furthermore, the periodicity information X is a signal having a periodicity corresponding to the periodicity of the periodic noise N.

The LMS computation unit 103 carries out coefficient computation on the basis of the periodicity information X sent from the input terminal 101 and the residual signal E sent from the step gain circuit 106 so that, for example, the noise power of the residual signal E is minimized. Then, the LMS computation unit 103 outputs the obtained filter coefficient W to the adaptive filter 102. The filter coefficient W is calculated for each sample. For example, when the number of samples corresponding to the periodicity information X is "m+1," the filter coefficients W corresponding to the samples will be W0, W1, W2, . . . , Wm.

The adaptive filter 102 carries out adaptive processing on the basis of the periodicity information X sent from the input terminal 101 and the filter coefficient W sent from the LMS computation unit 103. Then, the adaptive filter 102 outputs a filter output Y that approximates the periodic noise N to the subtracting terminal of the adder 104. The audio output signal S' is represented by the following formula:

$$S' = S + N - Y \qquad (2)$$

Since the filter output Y is a pseudo noise signal that approximates the periodic noise N, the audio output signal S' is a signal that approximates the main audio signal S and is obtained by reducing the periodic noise N included in the audio output signal S+N.

Figure 5:
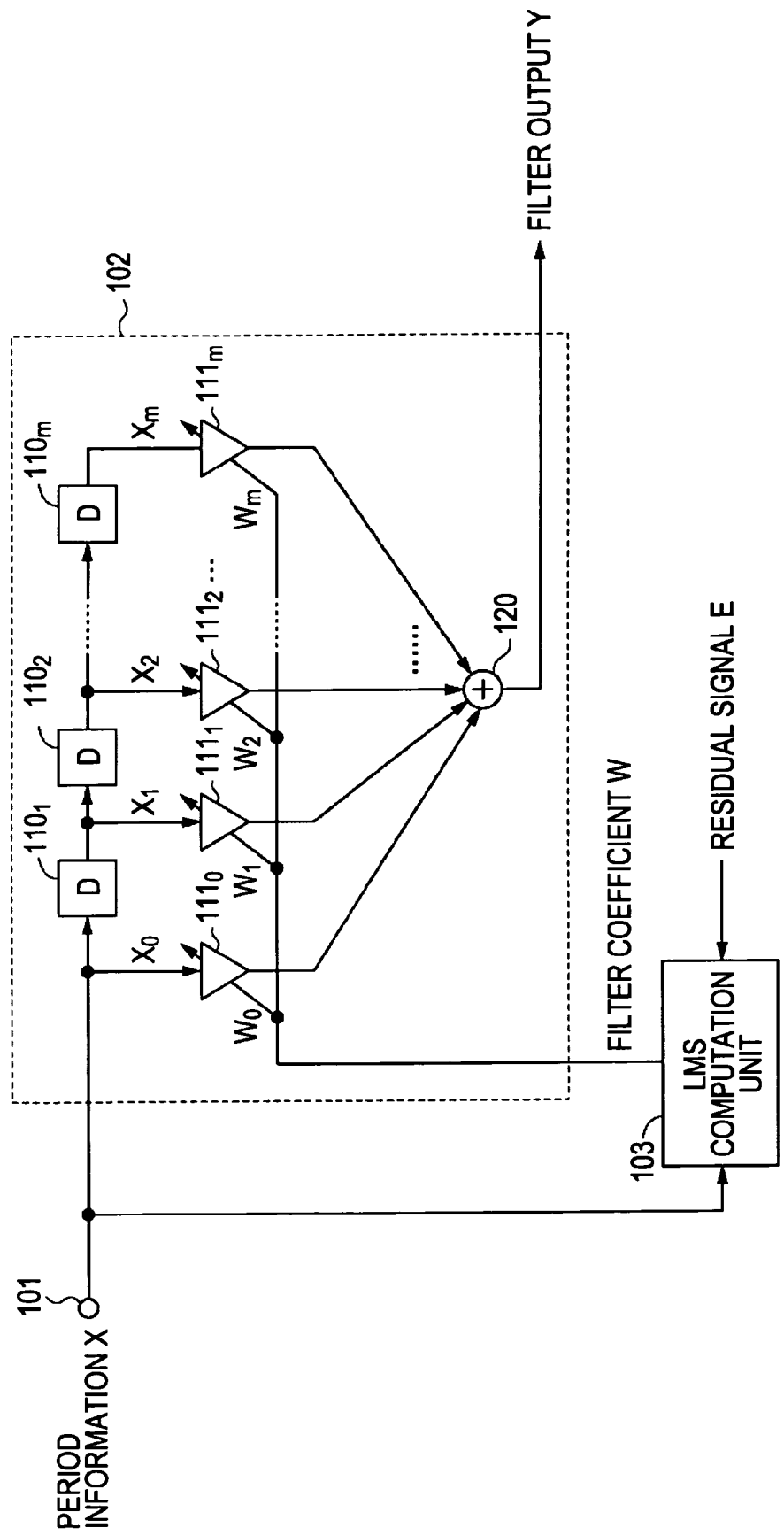
FIG. 5 illustrates a block diagram of an example configuration of an adaptive filter.

Next, an example configuration of the adaptive filter 102 will be described with reference to FIG. 5. The adaptive filter 102 includes, for example, a finite impulse response (FIR) digital filter having a plurality of taps.

The periodicity information X is supplied to a multiplier 1110 and a circuit in which delay elements 1101, 1102, . . . , 110m are connected in series. The delay elements 1101, 1102, . . . , 110m output sets of periodicity information X1, X2, . . . , Xm that are obtained by delaying the periodicity information X in sequence by sample unit minutes. The sets of the periodicity information X1, X2, . . . , Xm are supplied to multipliers 1111, 1112, . . . , 111m, respectively. The filter coefficients W0, W1, W2, . . . , Wm are supplied to the multipliers 1110, 1111, 1112, . . . , 111m, respectively.

The multipliers 1110, 1111, 1112, . . . , 111m multiply each of the sets of the periodicity information X0, X1, X2, . . . , Xm and each of the filter coefficients W0, W1, W2, . . . , Wm, respectively, and output the results to an adder 120. The adder 120 adds the signals sent from the multipliers 1110, 1111, 1112, . . . 111m and outputs a filter output Y. The filter output Y is represented by the following formula:

$$Y = \sum_{j=0}^{m} (Wj \cdot Xj) \quad (3)$$

The LMS computation unit 103 calculates the filter coefficients W0, W1, . . . , Wm on the basis of the periodicity information X input to the input terminal 101 and the residual signal E sent from the step gain circuit 106. The filter coefficients W0, W1, . . . , Wm are calculated using the following formula:

$$W_{k+1} = \lambda \cdot W_k + 2\mu \cdot E_k \cdot X_k \quad (4)$$

The character k subscript to each coefficient indicates that the value is the kth sample. Similarly, the subscript k+1 indicates that the value is the k+1th sample. Furthermore, λ represents a forgetting factor. The value of λ is normally set to a value slightly smaller than one. In this way, adaptive processing can be carried out by reducing the weight placed on a previous filter coefficient W so that data collected further back in time is discarded. Furthermore, μ represents a coefficient obtained at the adaptive filter 102. When μ is great, the convergence of the filter output Y output from the adaptive filter 102 can be fastened, but accuracy is reduced. In contrast, when μ is small, the convergence of the filter output Y is slowed, but accuracy is increased. Accordingly, an optimal value is selected for μ depending on the adaptive system to be used.

As described above, by feeding back the audio output signal S' and using the residual signal E for the adaptive processing carried out at the adaptive filter 102, the filter coefficient W can be adaptively updated and the filter output Y can be converged onto the periodic noise N. Then, by subtracting the filter output Y that approximates the periodic noise N from the audio input signal S+N, the periodic noise N included in the audio input signal S+N can be reduced. Here, since the synchronous adaptive filter subtracts the filter output Y that approximates the periodic noise N, the synchronous adaptive filter is advantageous in that it has less effect on the audio signal compared to a frequency adaptive comb filter.

Figure 6:
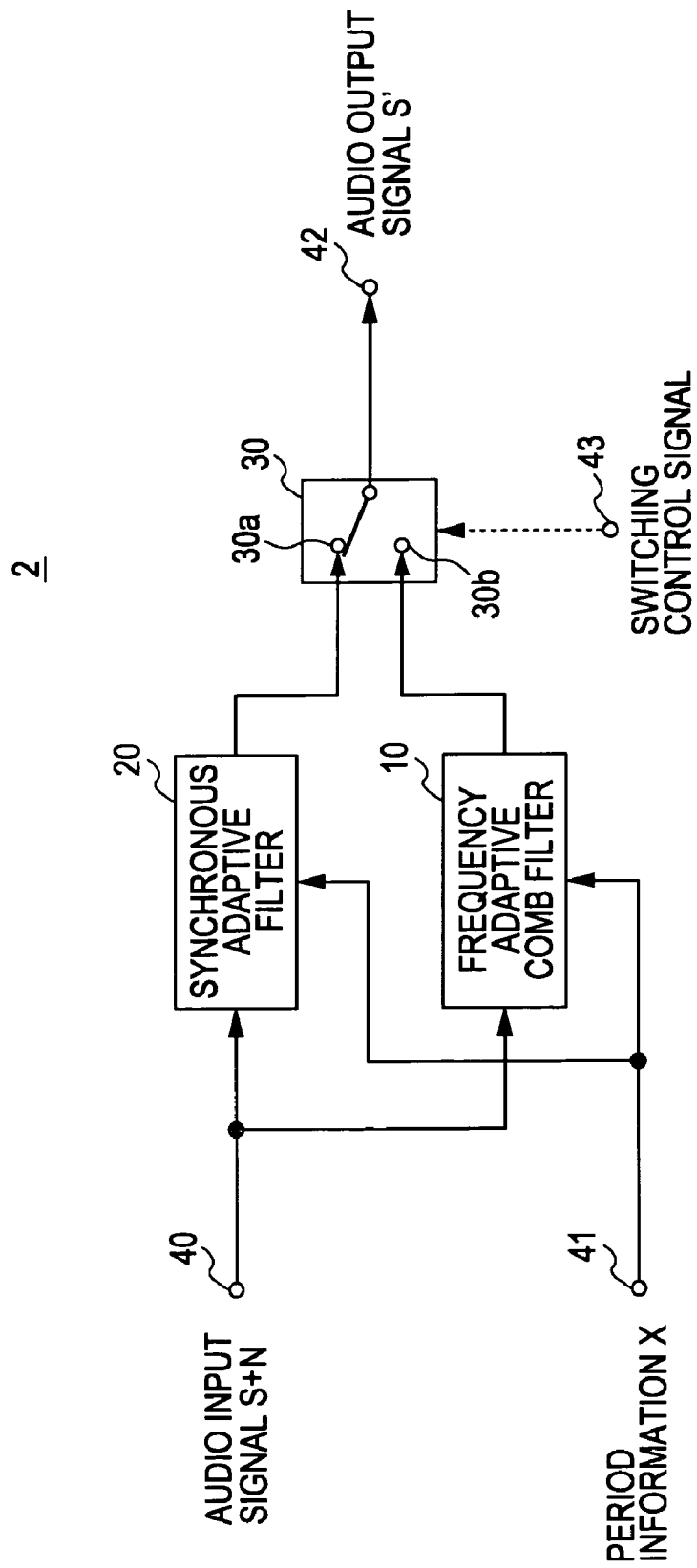
FIG. 6 illustrates a block diagram of an example configuration of a periodic noise reduction circuit according to a second embodiment of the present invention.

Next, a periodic noise reduction circuit 2 according to the second embodiment of the present invention will be described with reference to FIG. 6. The periodic noise reduction circuit 2 according to the second embodiment includes a synchronous adaptive filter 20 and a frequency adaptive comb filter 10. A selector 30 is used to switch between the filters.

The audio input signal S+N input to an input terminal 40 is supplied to the synchronous adaptive filter 20 and the frequency adaptive comb filter 10. The periodicity information X input to an input terminal 41 is supplied to the synchronous adaptive filter 20 and the frequency adaptive comb filter 10.

The synchronous adaptive filter 20 carries out periodic noise reduction processing on the supplied audio input signal S+N on the basis of the periodicity information X. The audio signal on which the periodic noise reduction processing is carried out is supplied to an input terminal 30a of the selector 30. The frequency adaptive comb filter 10 carries out periodic noise reduction processing on the supplied audio input signal S+N on the basis of the periodicity information X. The audio signal on which the periodic noise reduction processing is carried out is supplied to an input terminal 30b of the selector 30.

On of the input terminals of the selector 30 is selected on the basis of a predetermined switch control signal. The switch control signal for switching the input terminal of the selector 30 is, for example, output from a control unit configured to control an apparatus including the periodic noise reduction circuit 2 according to the second embodiment of the present invention. As the input terminal of the selector 30, for example, the input terminal 30a is normally selected to remove periodic noise N with the synchronous adaptive filter 20. If the periodic noise N cannot be removed using the synchronous adaptive filter 20, the input terminal 30b is selected to remove periodic noise N with the frequency adaptive comb filter 10. The audio signal supplied to the selected input terminal is output to an output terminal 42 as the audio output signal S'.

Figure 7:
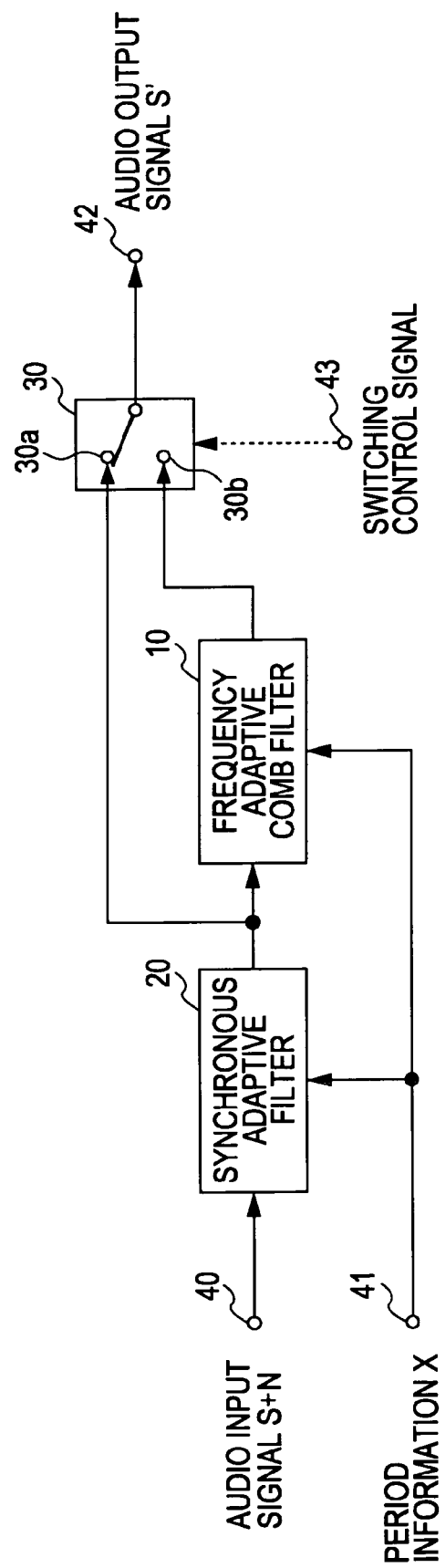
FIG. 7 illustrates a block diagram of an example configuration of a periodic noise reduction circuit according to a modification of a second embodiment of the present invention.

The frequency adaptive comb filter 10 and the synchronous adaptive filter 20 may be cascade connected. FIG. 7 illustrates the structure of a periodic noise reduction circuit 21 according to a modification of the second embodiment. Hereinafter, the components that are the same as those described with reference to FIG. 6 are indicated by the same reference numerals, and detailed descriptions thereof are not repeated. The audio input signal S+N is input to the input terminal 40 and is supplied to the synchronous adaptive filter 20.

The periodicity information X input to the input terminal 41 is supplied to the synchronous adaptive filter 20 and the frequency adaptive comb filter 10. The synchronous adaptive filter 20 carries out periodic noise reduction processing to reduce the periodic noise N in the supplied audio input signal S+N on the basis of the periodicity information X. The processed audio signal is output to the input terminal 30a of the selector 30 and the frequency adaptive comb filter 10.

The frequency adaptive comb filter 10 carries out periodic noise reduction processing to the audio signal supplied from the synchronous adaptive filter 20 and supplied the processed audio signal to the input terminal 30b of the selector 30. The selector 30 switches the input terminal between the input terminal 30a and the input terminal 30b on the basis of a predetermined switch control signal. The audio signal supplied to the selected input terminal of the selector 30 is output to the output terminal 42 as the audio output signal S'.

As the input terminal of the selector 30, for example, the input terminal 30a is normally selected to remove the periodic noise N at the synchronous adaptive filter 20. If the periodic noise N cannot be removed at the synchronous adaptive filter 20, the input terminal 30b is selected to remove the periodic noise N at the frequency adaptive comb filter 10.

As described above, the periodic noise reduction processing is carried out by the frequency adaptive comb filter 10 after the periodic noise reduction processing is carried out by the synchronous adaptive filter 20. However, the order of processing by the frequency adaptive comb filter 10 and the synchronous adaptive filter 20 may be switched.

The above-described frequency adaptive comb filter according to the first embodiment of the present invention has high ability of tracking the change in the periodicity of the periodic noise and is not affected by a fluctuation in the noise level of the periodic noise. At the same time, the frequency adaptive comb filter damps the periodic noise having a frequency that is an integral multiple of the frequency f and damps audio signals having frequencies that are integral multiples of the frequency f. In other words, frequency components of the main audio signal at frequencies that do not include noise and that are integral multiples of the frequency f are damped. According to the modification of the second embodiment of the present invention, a frequency adaptive comb filter and a synchronous adaptive filter are both used, and when the periodicity of the periodic noise is constant, the periodic noise can be effectively reduced by using the known synchronous adaptive filter that has a smaller affect on the main audio signal.

Figure 8:
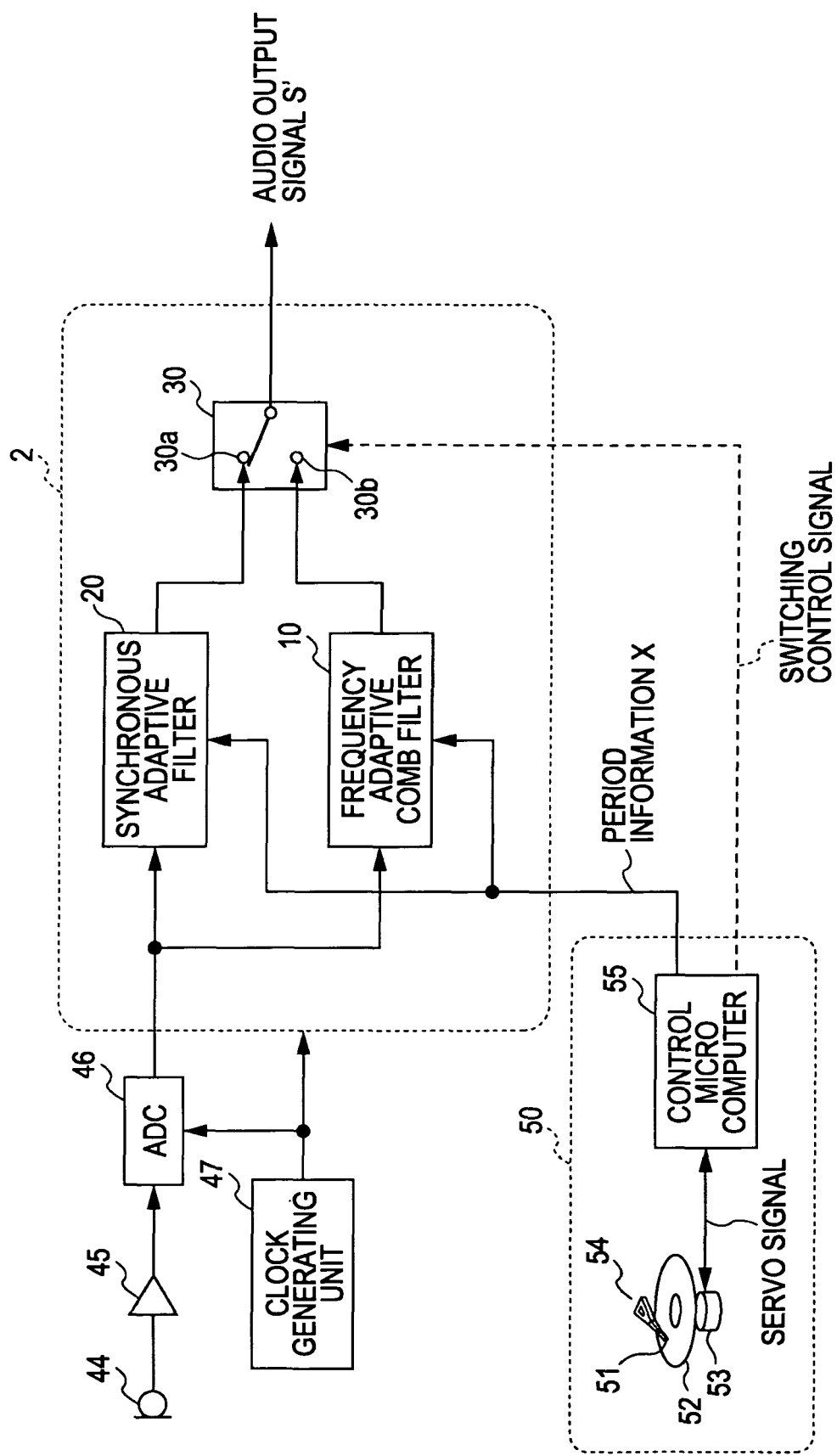
FIG. 8 illustrates a block diagram of an example configuration of an audio recording apparatus according to a third embodiment of the present invention.

Next, a third embodiment of the present invention will be described. An audio recording apparatus according to the third embodiment includes the periodic noise reduction circuit 1, 2, or 2' according to the first embodiment, the second embodiment, or the modification of the second embodiment, respectively. FIG. 8 illustrates an example configuration of an audio recording apparatus including the periodic noise reduction circuit. The audio recording apparatus illustrated in FIG. 8 includes the periodic noise reduction circuit 2 according to the above-described second embodiment. The audio recording apparatus uses, for example, a hard disk drive (HDD) 50 as a recording medium. Predetermined signal processing is carried out on the sound picked up by a microphone 44 and is recorded on the recording medium.

According to the third embodiment of the present invention, the periodic noise mixed into the main audio signal when picking up sound is reduced by using the periodic noise reduction circuit 2. The periodic noise is, for example, an electromagnetic sound of a spindle motor 53 configured to rotate a hard disk 52, noise generated at a roller bearing, and/or noise and vibration caused by the rotation of the hard disk 52. The frequency of the periodic noise is an integral multiple of the rotational frequency of the spindle motor 53. When the periodic noise is mixed into the main audio signal, the signal-to-noise ratio (S/N) of the sound is degraded. The structure of the audio recording apparatus shown in FIG. 8 only includes components that are especially important for periodic noise reduction processing, and the other components are not shown to simplify the drawing.

A control microcomputer 55 is constituted of, for example, a microcomputer and controls each component of the automobile position 50 on the basis of a program stored on a read only memory (ROM) in advance by using a random access memory (RAM) (not shown in the drawing) as a work memory for executing the program. The control microcomputer 55 generates a servo signal for controlling the rotation of the spindle motor 53 and supplies this servo signal to the spindle motor 53. The control microcomputer 55 generates the periodicity information X in synchronization with the periodicity of the spindle motor 53 on the basis of the servo signal and supplies the periodicity information X to the periodic noise reduction circuit 2.

The control microcomputer 55, for example, generates a switching control signal for switching input terminals of a selector 30 in response to a rotation control signal for the hard disk 52 and supplies this switch control signal to the periodic noise reduction circuit 2.

The spindle motor 53 controls the rotation of the hard disk 52 on the basis of the servo signal sent from the control microcomputer 55. While the hard disk 52 is rotated by the spindle motor 53, a magnetic head 51 attached to a voice coil motor (VCM) 54 read out and writes in data from and onto the magnetic surface film.

The microphone 44 picks up a main audio signal S and a periodic noise N that is generated by the rotation of the spindle motor 53 and outputs an audio input signal S+N that includes both the main audio signal S and the periodic noise N. The audio input signal S+N is amplified by an amplifier 45 and is supplied to an analog/digital (A/D) converter 46.

A clock generating unit 47 generates a sampling clock for sampling the audio input signal S+N. The generated sampling clock is supplied to the A/D converter 46 and the periodic noise reduction circuit 2. The A/D converter 46 converts the audio input signal S+N supplied from the amplifier 45 into a digital audio input signal S+N and supplies the digital audio input signal S+N to the periodic noise reduction circuit 2.

The digital audio input signal S+N supplied to the periodic noise reduction circuit 2 is supplied to a frequency adaptive comb filter 10 and a synchronous adaptive filter 20. The periodicity information X supplied from the control microcomputer 55 is supplied to the frequency adaptive comb filter 10 and the synchronous adaptive filter 20. The sampling clock supplied to the periodic noise reduction circuit 2 is supplied to the frequency adaptive comb filter 10 and the synchronous adaptive filter 20.

Periodic noise reduction processing is carried out on each of the audio input signals S+N supplied to the frequency adaptive comb filter 10 and the synchronous adaptive filter 20 on the basis of the periodicity information X and the sampling clock, as described above with reference to FIGS. 1 and 4. The audio signal output from the synchronous adaptive filter 20 is supplied to an input terminal 30a of a selector 30. The audio signal output from the frequency adaptive comb filter 10 is supplied to an input terminal 30b of the selector 30. The input terminal of the selector 30 is selected in accordance with the switching control signal supplied from the control microcomputer 55. The audio signal supplied to the selected input terminal is output as an audio output signal S'.

Predetermined signal processing is carried out on the audio output signal S' output from the periodic noise reduction circuit 2 by, for example, a signal processing unit (not shown in the drawings). Then, the processed audio output signal S' is recorded on the hard disk 52.

Figure 9:
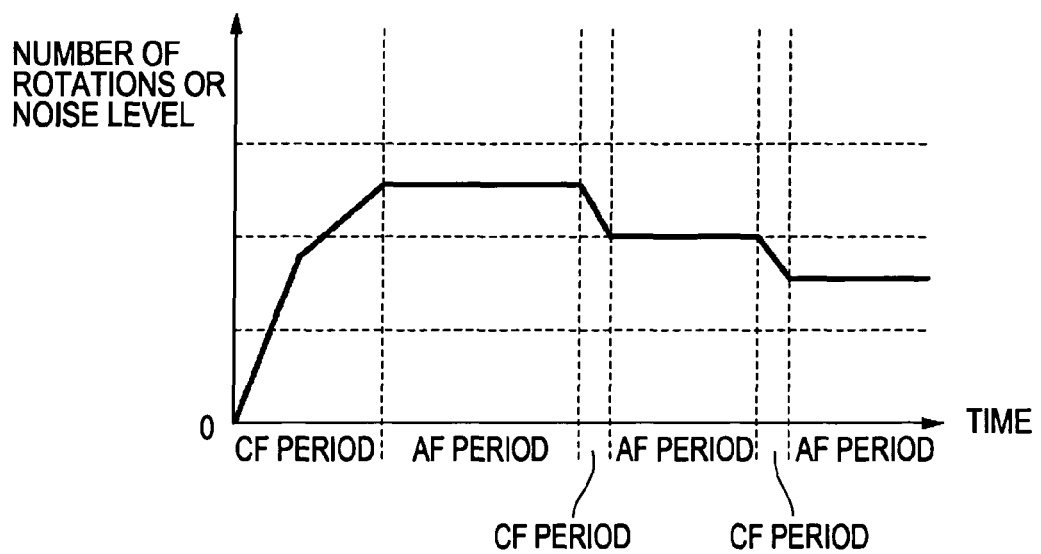
FIG. 9 illustrates the change of the periodicity or the noise level of a periodic noise.

Next, the timing for selecting an input terminal of the selector 30 will be described. FIG. 9 illustrates the change over time in the number of rotations of the spindle motor or the change over time in the noise level of the periodic noise. In general, when the number of rotations of the spindle motor increases, the generated noise power increases, causing the noise level of the periodic noise to increase. The vertical axis of the graph shown in FIG. 9 represents the number of rotations of the spindle motor and the periodicity of the periodic noise.

For example, when the vertical axis of the graph shown in FIG. 9 represents the number of rotations of the spindle motor, there will be periods in which the number of rotations of the spindle motor is constant and periods in which the number of rotations of the spindle motor changes, as shown in FIG. 9. If the period in which the number of rotations of the spindle motor is constant is defined as an AF period, the AF period is, for example, a time period in which the hard disk 52 is continuously accessed. If the period in which the number of rotations of the spindle motor changes is defined as a CF period, the CF period is, for example, a time period in which the hard disk 52 is discontinuously accessed during, for example, seek operation.

During an AF period in which the number of rotations of the spindle motor is constant, for example, the input terminal 30a of the selector 30 is selected. In a CF period in which the number of rotations of the spindle motor changes, for example, the input terminal 30b of the selector 30 is selected.

In other words, in an AF period, the synchronous adaptive filter 20 that affects the main audio signal S to a smaller degree is used. In a CF period, the frequency adaptive comb filter 10, whose ability of tracking the periodic noise is high, is used for a signal whose periodic noise has been reduced by the synchronous adaptive filter 20.

In this way, even when the number of rotations of the spindle motor changes and the periodicity of the periodic noise changes, suitable periodic noise reduction processing can be carried out with less affect on the main audio signal to reduce the periodic noise. More specifically, the periodic noise N that is caused by the rotation of the spindle motor 53 can be reduced in the audio input signal S+N that is a combination of the main audio signal S, which is the target sound of the pick up, and the periodic noise N. After the periodic noise N is reduced, the signal can be recorded on a recording medium.

When the vertical axis of the graph shown in FIG. 9 represents the noise level of the periodic noise and the noise level of the periodic noise changes, as shown in FIG. 9, the input terminal of the selector 30 can be selected as described above. In other words, in an AF period in which the noise level of the periodic noise is constant, for example, the input terminal 30a of the selector 30 is selected and the synchronous adaptive filter 20 is used. In a CF period in which the noise level of the periodic noise changes, for example, the input terminal 30b of the selector 30 is selected and the frequency adaptive comb filter 10 is used.

Furthermore, for example, when the number of rotation of the spindle motor and the noise level of the periodic noise both change, as shown in FIG. 9, the same filters as described above may be employed.

As described above, the input terminal 30a is selected during an AF period in which the periodicity of the periodic noise N is constant and the input terminal 30b is selected during a CF period in which the periodicity of the periodic noise N changes. However, the terminal selection is not limited thereto. For example, instead, immediately after the periodicity of the periodic noise N becomes constant, the input terminal 30b may be selected to use the frequency adaptive comb filter 10 for a predetermined amount of time since some time is required for the pseudo noise signal at the synchronous adaptive filter 20 to converge onto a predetermined value.

In the above-described third embodiment, the periodic noise reduction circuit 2 according to the second embodiment was employed. However, the periodic noise reduction circuit is not limited thereto, and either the periodic noise reduction circuit 1 or 2' according to the first embodiment or second embodiment, respectively, may be used. For example, if the periodic noise reduction circuit 1 is used, periodic noise reduction processing is carried out only by the frequency adaptive comb filter 10. Therefore, a switching control signal is not required to be supplied from the control microcomputer 55 to the periodic noise reduction circuit 1. If the periodic noise reduction circuit 2' is used, periodic noise reduction processing is carried out by switching between the frequency adaptive comb filter 10 and the synchronous adaptive filter 20 in response to the periodicity of the periodic noise. Therefore, the periodic noise reduction circuit 2' can be employed in the same manner as the periodic noise reduction circuit 2.

According to the third embodiment, a hard disk is used as a recording medium. However, the recording medium used for the audio recording apparatus according to the third embodiment is not limited thereto and, for example, may be a disk-shaped recording medium, such as a recordable digital versatile disk (DVD) or a recordable compact disk (CD). Moreover, a magneto-optical disk may be used.

Figures 10, 10A:
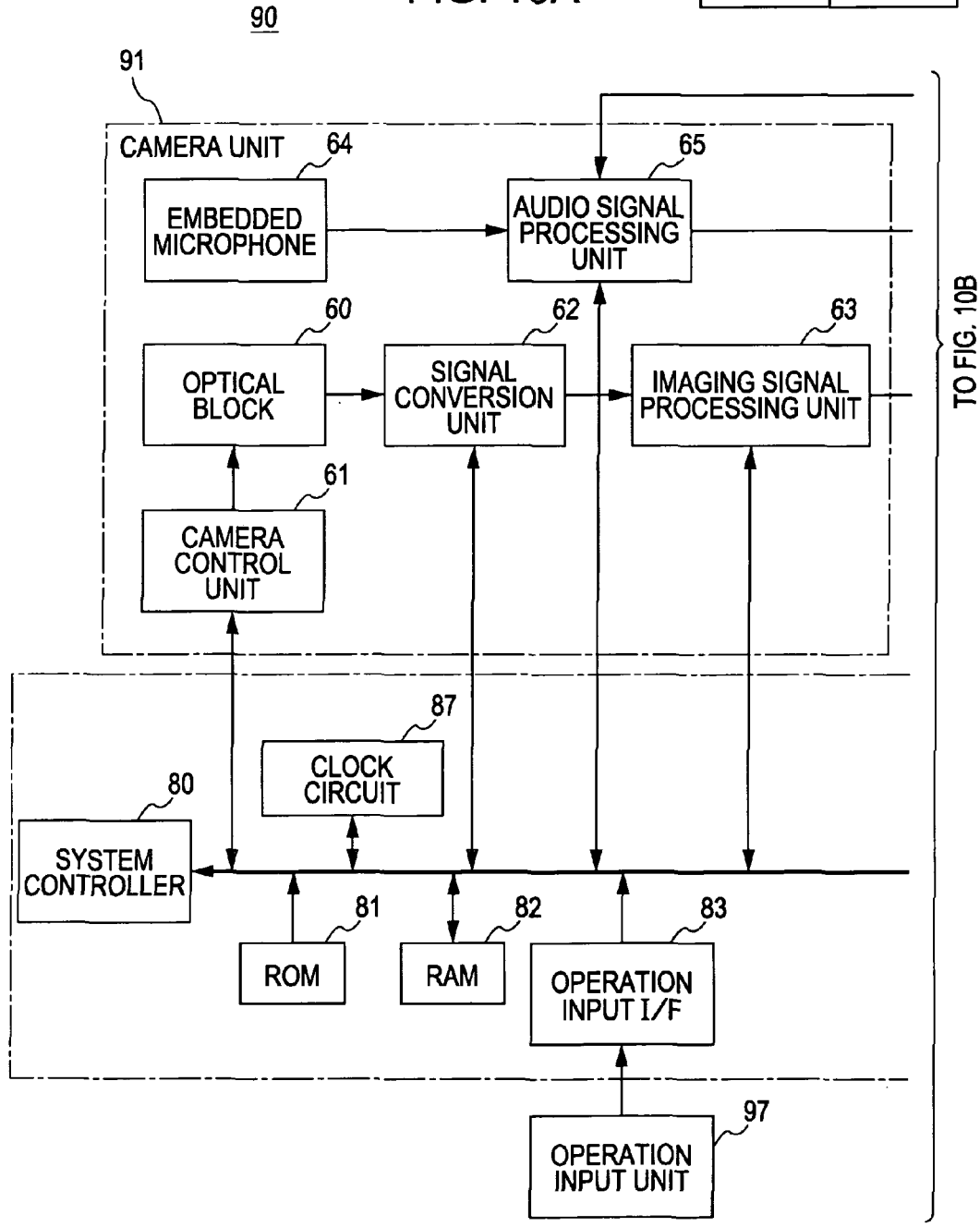
FIG. 10 illustrates a block diagram of an example configuration of an imaging apparatus according to a fourth embodiment of the present invention.
Figure 10B:
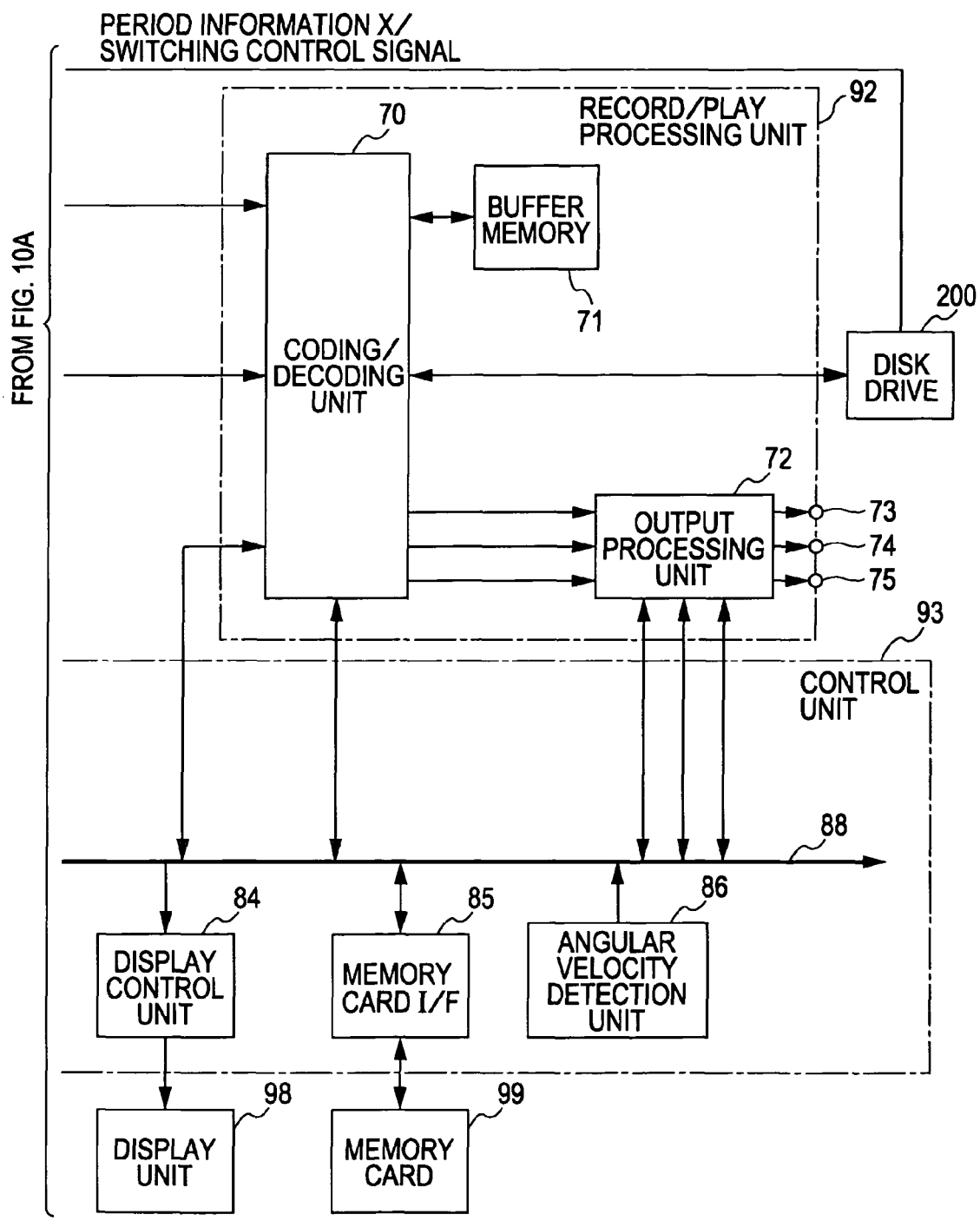

Next, a fourth embodiment of the present invention will be described. According to the fourth embodiment, the periodic noise reduction circuit according to the first embodiment, second embodiment, or the modification of the second embodiment is included in an imaging apparatus, such as a portable video camera with a microphone or a digital camera with a microphone. FIG. 10 illustrates an example configuration of an imaging apparatus 90 according to the fourth embodiment. The imaging apparatus 90 uses, for example, a disk-shaped recording medium as a recording medium and is capable of efficiently reducing periodic noise caused by a spindle motor configured to rotate the disk-shaped recording medium during recording.

As the disk-shaped recording medium, a recordable DVD may be used. However, the disk-shaped recording medium is not limited thereto and a recordable CD, a hard disk, or a magneto-optical disk may also be used. In the description below, the disk-shaped recording medium is a recordable DVD.

The imaging apparatus 90 includes a camera unit 91, a record/play processing unit 92, and a control unit 93. The camera unit 91 includes an optical block 60, a camera control unit 61, a signal converter 62, an imaging signal processing unit 63, an embedded microphone 64, and an audio signal processing unit 65. The optical block 60 accommodates a lens group for capturing an image of an object, an aperture adjustment mechanism, a focus adjustment mechanism, a zoom mechanism, a shutter mechanism, a flash mechanism, and a camera-shake correction mechanism. The camera control unit 61 receives a control signal from the control unit 93 and generates a control signal to be supplied to the optical block 60. The generated control signal is supplied to the optical block 60 in order control the zooming operation, the shutter operation, and the exposure.

The signal converter 62 includes an imaging device, such as a charge coupled device (CCD). An image is formed on the imaging surface of the signal converter 62 through the optical block 60. The signal converter 62 receives a timing signal for image capturing from the control unit 93 in accordance with a shutter operation, converts the image of the object formed on the imaging surface into an imaging signal, and supplies the imaging signal to the imaging signal processing unit 63.

The imaging signal processing unit 63 carries out various types of processing, such as gamma correction and auto gain control (AGC), on the imaging signal on the basis of the control signal sent from the control unit 93 and carries out a conversion process for converting the imaging signal into a digital image signal. The imaging signal processing unit 63 also carries out various types of control processing, such automatic white balance control and exposure correction control, on the digital image signal on the basis of the control signal sent from the control unit 93.

The embedded microphone 64 is disposed inside a chassis of the imaging apparatus 90. The embedded microphone 64 picks up sound, converts this sound into an electric signal, and outputs the electric signal as an audio signal. When picking up sound, the embedded microphone 64 picks up both a main audio signal, which is the target sound to be picked up, and a periodic noise generated, for example, by the spindle. The audio signal from the embedded microphone 64 is sent to the audio signal processing unit 65. The audio signal processing unit 65 carries out various types of processing, such as sound quality correction and AGC, on the audio signal that is sent from the embedded microphone 64 and converts the audio signal into a digital audio signal.

The audio signal processing unit 65 includes the periodic noise reduction circuit 1, 2, or 2' according to the first embodiment, the second embodiment, or the modification of the second embodiment, respectively. The audio signal processing unit 65 receives a switching control signal and periodicity information X from a disk drive 200, described below, and, by using the switching control signal and the periodicity information X, carries out periodic noise reduction processing on the input digital audio signal.

Figure 11:
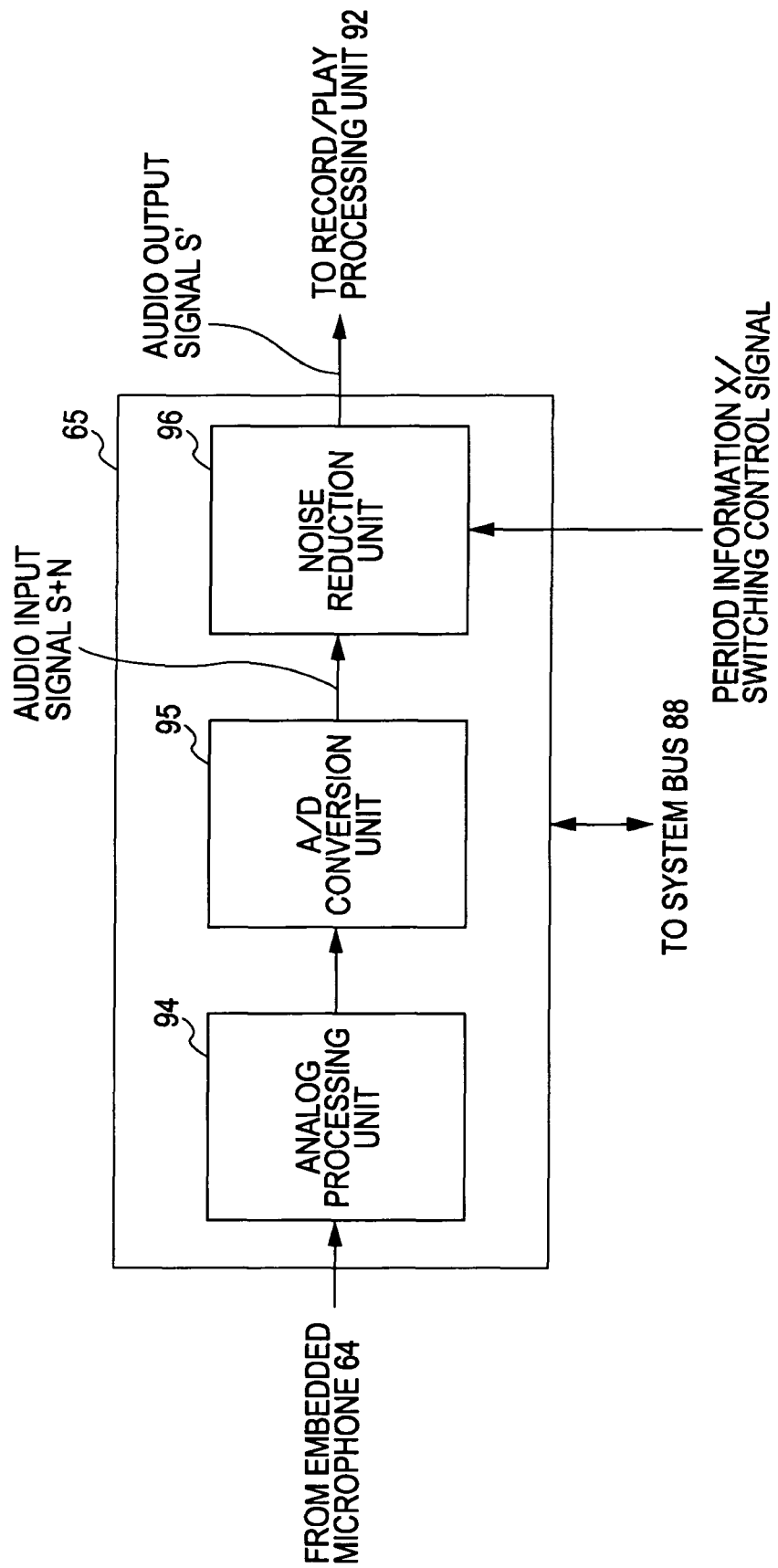
FIG. 11 illustrates a block diagram of an audio signal processing unit.

FIG. 11 illustrates an example configuration of the audio signal processing unit 65. The audio signal processing unit 65, for example, includes an analog processing unit 94, an A/D converter 95, and a periodic noise reduction unit 96. At the analog processing unit 94, various types of processing, such as audio quality correction and AGC, are carried out on the audio signal sent from the embedded microphone 64. The processed audio signal is converted into a digital audio signal at the A/D converter 95. The digital audio signal is an audio input signal S+N obtained by combining an audio signal S with a periodic noise N generated at a spindle motor. The audio input signal S+N is supplied to the periodic noise reduction unit 96.

The periodic noise reduction unit 96 carries out the periodic noise reduction process according to the first embodiment, the second embodiment, or the modification of the second embodiment on the audio input signal S+N sent from the A/D converter 95 by using the periodicity information X sent from a spindle driver configured to control the spindle motor of the disk drive 200 and the switching control signal sent from a microcomputer configured to control the disk drive 200. By carrying out the periodic noise reduction process, the periodic noise reduction unit 96 obtains an audio output signal S' by removing the periodic noise N from the audio input signal S+N. The obtained audio output signal S' is supplied to the record/play processing unit 92.

When the periodic noise reduction circuit 2 or 2' according to the second embodiment or the modification of the second embodiment, respectively, is used, a method of switching of the selector 30 according to the above-described third embodiment can be employed.

Referring back to FIG. 10, the record/play processing unit 92 includes a coding/decoding unit 70, a buffer memory 71, and an output processing unit 72. The coding/decoding unit 70 carries out compression coding and multiplexing of image signals and audio signals from the camera unit 91 and addition recording information by using, for example, the buffer memory 71 including a synchronous dynamic random access memory (SDRAM). Then, the image signal, the audio signals, and the addition recording information are sent to the disk drive 200 and are recorded on a recoding medium in the disk drive 200. A signal read out from the recording medium at the disk drive 200 is decoded at the coding/decoding unit 70 by using the buffer memory 71 to separate the image signals, the audio signals, and the addition recording information from the compression coded and multiplexed data. Details of the disk drive 200 will be described below.

The output processing unit 72 supplies compressed data from the coding/decoding unit 70 to the control unit 93 and output terminals 73 to 75 on the basis of the control by the control unit 93.

The control unit 93 includes a system controller 80, a ROM 81, a RAM 82, an operation input interface 83 for connecting an operation input unit 97, a display control unit 84 for connecting a display unit 98, a memory card interface 85 for installing a memory card 99, an angular velocity detector 86 configured to detect angular velocity for camera-shake correction, and a clock circuit 87 for recording the time of the imaging, all being connected to each other via a system bus 88.

The system controller 80 carries out processing for the entire control unit 93 and uses the RAM 82 as a work area. The ROM 81 stores programs for controlling the camera unit 91 and for controlling the recording and playing operations of image signals and audio signals.

The operation input unit 97 connected to the operation input interface 83 includes a plurality of keys, such as a mode switching key for switching between different modes, such as an imaging mode and a playing mode, a zoom adjustment key, an exposure adjustment key, a shutter key, a moving image key for capturing a moving image, and a display adjustment key for adjusting the display unit 98. The operation input interface 83 sends an operation signal from the operation input unit 97 to the system controller 80. The system controller 80 determines which key has been operated at the operation input unit 97 and carries out control processing in accordance with the determination result.

The display unit 98 connected to the display control unit 84 includes, for example, a liquid crystal display (LCD) and displays image signals from the camera unit 91 or image signals read out from the disk drive 200 under the control of the system controller 80.

The memory card interface 85 writes in the compressed data from the coding/decoding unit 70 onto the memory card 99. The memory card interface 85 reads out the compressed data from the memory card 99 and sends the compressed data to the coding/decoding unit 70. The clock circuit 87 generates time information representing year, month, date, hour, minute, and second.

The angular velocity detector 86 is a gyroscope configured to detect the angular velocity applied to the imaging apparatus 90 from outside. The angular velocity information $\omega=(\theta/\text{second})$ from the angular velocity detector 86 is reported to the system controller 80 at every predetermined time interval. If the integration value $\theta$ from the beginning of the recording exceeds a predetermined value (e.g., 5°), it is determined that the limit of the camera-shake correction has been exceeded and a flag is set to the STB_LIM of the additional recording information. Here, $\omega$ is a positive value (+$\omega$) when a rightward displacement with respect to the center of the screen is detected, and $\omega$ is a negative value (−$\omega$) when a leftward displacement with respect to the center of the screen is detected. Limit values are set for both the left and right directions.

Figure 12:
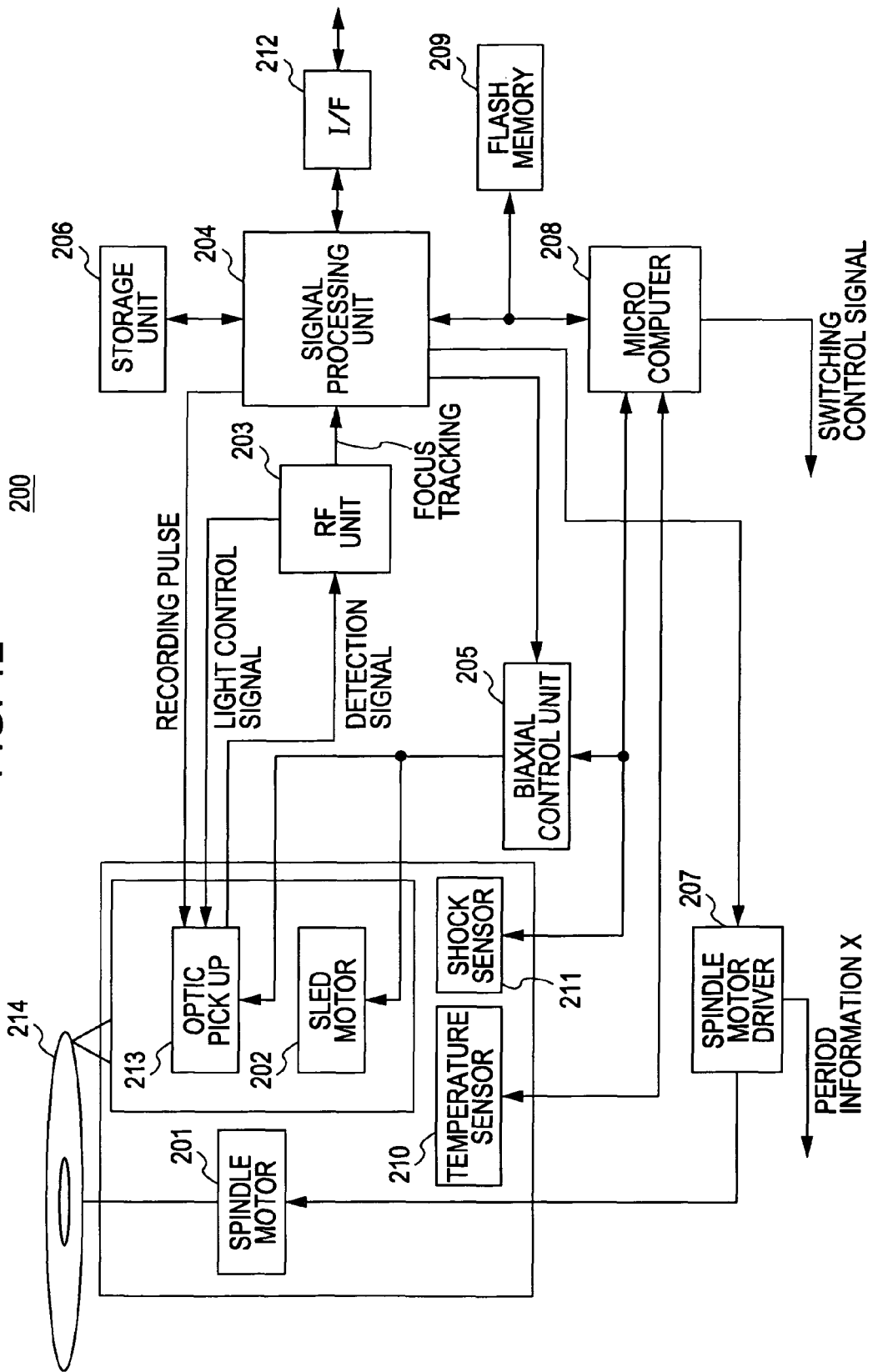
FIG. 12 illustrates a block diagram of a disk drive.

FIG. 12 illustrates an example configuration of the disk drive 200. The disk drive 200 includes a spindle motor 201 configured to rotationally drive a recordable optical disk 214, a spindle motor driver 207 configured to generate a driving signal for driving the spindle motor 201 and supplying the driving signal to the spindle motor 201, an optical pick-up 213 configured to emit a laser beam onto the recordable optical disk 214 and receive the laser beam reflected at the recordable optical disk 214, a sled motor 202 configured to move the optical pick-up 213 in the radial direction of the recordable optical disk 214, and a biaxial control unit 205 (not shown in the drawing) that is disposed in the optical pick-up 213.

The disk drive 200 includes an RF unit 203 configured to process an output signal from the optical pick-up 213, a signal processing unit 204 configured to generate various control signals based on the output from the RF unit 203, a microcomputer 208 configured to control the entire disk drive 200 on the basis of a program stored in the ROM (not shown in the drawing) in advance, a non-volatile memory (flash memory) 209 configured to the store written data even after the power supply is shut off, and an interface (I/F) unit 212 configured to control the communication between the disk drive 200 and the outside, i.e., the above-described record/play processing unit 92.

The spindle motor 201 is constructed by attaching a disk table for loading the recordable optical disk 214 to a driving shaft as a single unit. The spindle motor 201 rotates the recordable optical disk 214 loaded on the disk table by rotationally driving the driving shaft at, for example, a constant linear velocity (CLV) or a constant angular velocity (CAV) on the basis of a driving signal sent from the spindle motor driver 207.

The spindle motor driver 207 outputs a pulse corresponding to the rotation of the driving shaft on the basis of communication carried out between the signal processing unit 204 and the microcomputer 208. The pulse is supplied to the audio signal processing unit 65 as periodicity information X that is in synchronization with the periodicity of the periodic noise. The microcomputer 208 generates a switching control signal on the basis of communication carried out between the microcomputer 208 and the signal processing unit 204 and supplies the generated switching control signal to the audio signal processing unit 65.

Although not shown in the drawings, the optical pick-up 213 includes a laser diode provided as a laser beam source, a laser diode driver configured to drive the laser diode, an optical system configured to focus the laser beam emitted from the laser diode onto a recording layer of the recordable optical disk 214, and a photodetector configured to detect the laser beam reflected from the recordable optical disk 214. The optical system is biaxially driven in the surface direction and the radial direction of the disk on the basis of the driving signal sent from the biaxial control unit 205 so as to control focusing and tracking.

The optical system, for example, splits a laser beam into one zero order beam and two first order beams and emits these beams onto the recordable optical disk 214. The photodetector, for example, includes a two segment detector in which the photoreceptive surface is divided into two segments and a four segment detector in which the photoreceptive surface is divided into four segments. The two reflected first order beams are received at the two segment detector, and the reflected zero order beam is received at the four segment detector. Then, detection signals corresponding to the photoreceptive surfaces are output.

The detection signals from the photoreceptive surfaces of the photodetector output from the optical pick-up 213 are supplied to the RF unit 203. The RF unit 203 carries out amplification processing to the supplied detection signals and carries out predetermined calculations among the signals to generate a focus error signal and a tracking error signal. At the same time, the RF unit 203 generates a play RF signal corresponding to the laser beams reflected from the recordable optical disk 214. The focus error signal and the tracking error signal are supplied to the signal processing unit 204. The play RF signal is demodulated in a predetermined manner and is supplied to the signal processing unit 204 as a play signal.

The RF unit 203 generates a light intensity control signal for controlling the intensity of the laser beam emitted at the recordable optical disk 214 from the optical pick-up 213 on the basis of the signal supplied from the optical pick-up 213 and supplies this light intensity control signal to the laser diode driver of the optical pick-up 213. During the playing process, the RF unit 203 generates a light intensity control signal for maintaining the laser beam that is emitted onto the recordable optical disk 214 from the optical pick-up 213 at a constant intensity. During a recording process, the RF unit 203 controls the level of the light intensity control signal on the basis of the record signal output from the signal processing unit 204.

During the playing process, the signal processing unit 204 carries out A/D conversion on the supplied play signal and temporarily stores the converted play signal in a storage unit 206 on the basis of the control by the microcomputer 208. Then, the signal processing unit 204 uses the storage unit 206 to carry out decoding of the recorded code of the play data and decoding of the error correction code. The decoded play data is read out from the storage unit 206 at a predetermined timing and is supplied to the record/play processing unit 92 via the I/F 212.

During the recording process, the signal processing unit 204 temporarily stores the recording data supplied via the I/F 212 in the storage unit 206. Then, the signal processing unit 204 carries out error correction coding and recording coding of the recording data. A recording pulse is generated on the basis of the processed recording data, and the generated recording pulse is supplied to the optical pick-up 213.

The signal processing unit 204 generates management information for the data recorded on the recordable optical disk 214 and temporarily stores this management information on, for example, the main bus 209. Then, in accordance with, for example, an instruction by the microcomputer 208, the signal processing unit 204 refers to the management information stored on the main bus 209 to control each component of the disk drive 200 so as to employ various playing methods, such as random playing and shuffle playing.

A/D conversion and predetermined signal processing are carried out on the focus error signal and the tracking error signal supplied to the signal processing unit 204. Then, the signals are supplied to the biaxial control unit 205. The biaxial control unit 205 controls the operation of the biaxial mechanism of the optical pick-up 213 on the basis of the supplied signals. The biaxial control unit 205 follows the instructions from the microcomputer 208 to generate a driving signal for moving the optical pick-up 213 to a predetermined tracking position on the recordable optical disk 214. The driving signal is supplied to the sled motor 202.

Figure 13B:
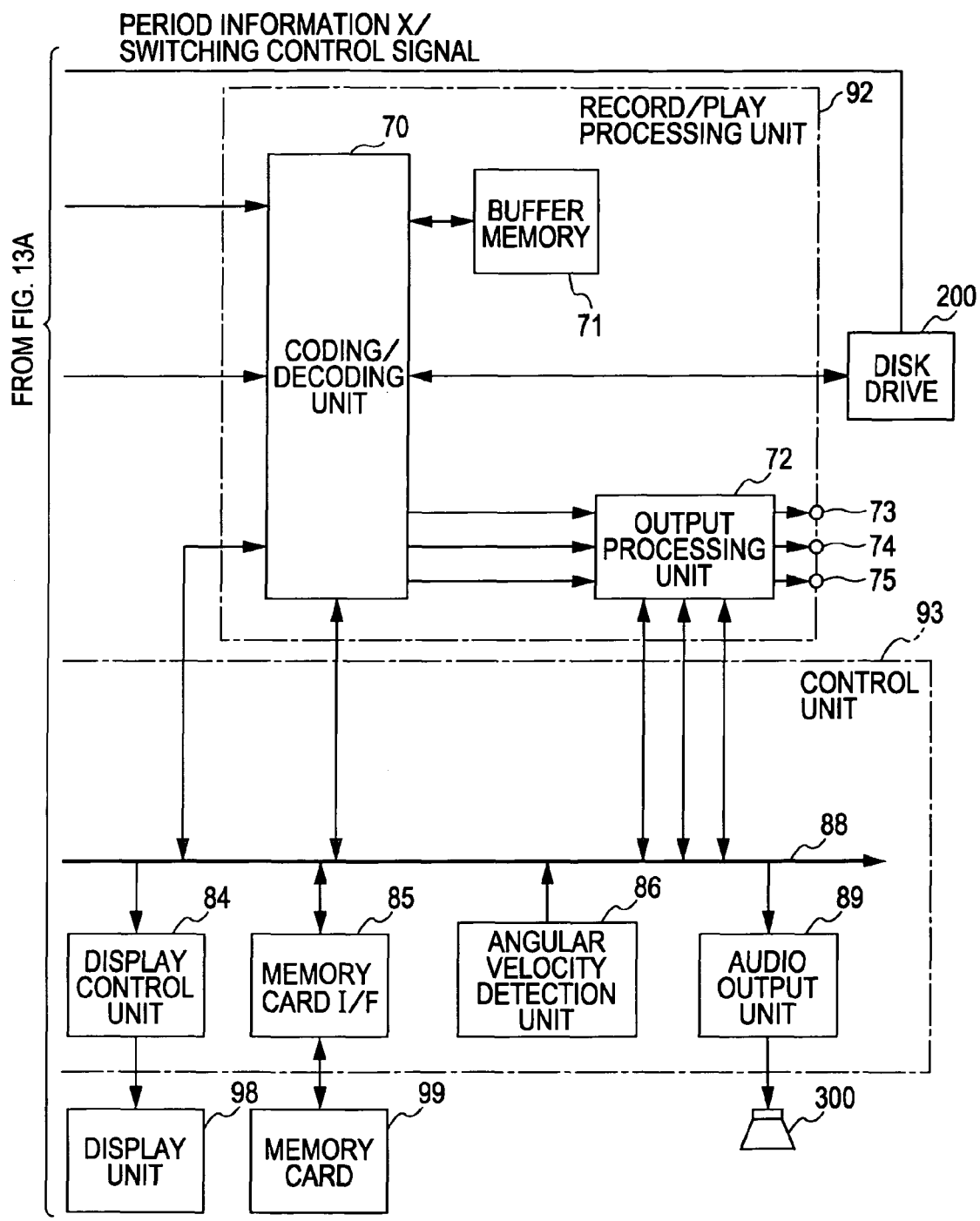
FIG. 13 illustrates a block diagram of an example configuration of an imaging apparatus according to a fifth embodiment of the present invention.

Next, a fifth embodiment of the present invention will be described with reference to FIG. 13. According to the fifth embodiment, periodic noise combined with an audio signal during recording is reduced when playing the audio signal stored on a recording medium as an image or sound. Hereinafter, the components that are the same as those described with reference to FIG. 10 are indicated by the same reference numerals, and detailed descriptions thereof are not repeated.

Here, a case in which a recording medium storing a main audio signal including a periodic noise in an unreduced state is played using an apparatus including a disk drive having the same structure as that shown in FIG. 11. The periodic noise included the main audio signal is generated when a spindle motor configured to rotationally drive a disk-shaped recording medium, such as an optical disk, is rotated. The rotational frequency of the spindle motor in case, for example, driving a DVD video is set according to a predetermined standard. Therefore, when playing a recording medium using an apparatus different from that used for recording, the rotational frequency of the spindle motor of the apparatus used for playing is the same as the rotational frequency of the spindle motor of the apparatus used for recording.

For example, when a recording medium storing data recorded in accordance with the CLV control method using a first apparatus is played in accordance with the CLV control method using a second apparatus, the number of rotations of the spindle motor at the moment of recording data at a predetermined position on the recording medium is the same as the number of rotations of the spindle motor at the moment of playing the data recorded at the predetermined position on the recording medium. Therefore, the periodicity of the recorded periodic noise and the periodicity of the played periodic noise are the same.

In other words, even when the apparatus used for recording differs from the apparatus used for playing, the periodicity of the recorded periodic noise and the periodicity of the played periodic noise are the same. Therefore, even when the apparatus used for recording differs from the apparatus used for playing, the periodic noise can be reduced on the basis of periodicity information X supplied from the spindle motor driver of the apparatus used for playing.

Now, an overview of the playing operation of the audio signal stored on a disk-shaped recording medium, such as an optical disk, will be described. During playing, a recordable optical disk 214 is loaded onto a disk table attached to the driving shaft of a disk drive 200, and the recordable optical disk 214 is rotated by a spindle motor 201. At this time, a spindle motor driver 207 that controls the rotation of the spindle motor 201 generates periodicity information X on the basis of communication carried out between a signal processing unit 204 and a microcomputer 208 in the same manner as that according to the fourth embodiment of the present invention. The microcomputer 208 generates a switching control signal. The generated periodicity information X and the switching control signal are supplied to an audio signal processing unit 65.

A detection signal output from a optical pick-up 213 of the disk drive 200 on the basis of a beam emitted onto and reflected at the optical disk is processed at the RF unit 203. Then, the processed detection signal is supplied to the signal processing unit 204 as a play signal. The play signal is processed at the signal processing unit 204 and is supplied to a record/play processing unit 92 via an I/F 212.

The compressed coded and multiplexed play data supplied to the record/play processing unit 92 is sent to a coding/decoding unit 70. The coding/decoding unit 70 uses a buffer memory 71 to separate and decode an image signal, an audio signal, and additional recording information from the play data. The decoded audio signal is supplied to an audio signal processing unit 65. At the audio signal processing unit 65, periodic noise reduction processing according to the first embodiment, the second embodiment, or the modification of the second embodiment, respectively, is carried out at the periodic noise reduction circuit 1, 2, or 2' on the basis of the periodicity information X and the switching control signal supplied from the disk drive 200. In this way, the play data is output after the periodic noise included in the play data is reduced. The audio signal whose periodic noise is reduced is supplied to an audio output unit 89 connected to the audio signal processing unit 65 via a system bus 88 and is output from a speaker 300 as sound.

In the above, a method of reducing periodic noise employed to a case in which the rotational frequency of the spindle motor configured to rotate an optical disk changes has been described. However, the application of the method is not limited thereto, and the method may be employed when, for example, the periodicity of the periodic noise is constant but the noise level of the periodic noise is variable.

For example, when a magnetic tape is used as a recording medium, the number of rotations of the magnetic tape during recording and playing is set in advance by a predetermined standard. Therefore, the periodicity of the periodic noise generated by the rotation of a rotary drum is constant. However, for example, for an imaging apparatus, when a microphone used for picking up sound is switched from a microphone embedded in a chassis to an outside microphone connected to the imaging apparatus, the volume of the periodic noise that is picked up may differ since the sensitivity of the microphones differs. In such a case, when switching the microphones, the noise level of the periodic noise picked up changes. Therefore, the periodic noise reduction circuit 1, 2, or 2' according to the first embodiment, the second embodiment, or the modification of the second embodiment, respectively, may be employed.

It should be understood by those skilled in the art that various modifications, combinations, sub-combinations and alterations may occur depending on design requirements and other factors insofar as they are within the scope of the appended claims or the equivalents thereof.

The invention claimed is:

1. An audio signal processing circuit comprising:
a first filter including,
a counter arranged to receive periodicity information synchronized with periodicity of a periodic noise included in an input signal and to convert the periodicity information to delay information,
a variable delaying unit configured to receive the delay information from the counter and to carry out delay processing so as to delay a level adjusted signal supplied thereto by an amount of time determined on the basis of the delay information, and
a filter unit configured to receive the input signal, the filter unit having a notch characteristic at a frequency f, the frequency f satisfying f=N/T, where N represents an integer equal to or greater than one and T represents a delaying time applied by the delaying unit,
in which the level adjusted signal is supplied to the variable delaying unit from the filter unit;
a second filter including,
an adaptive filter unit configured to output a pseudo noise signal approximating the periodic noise on the basis of the periodicity information, and
a subtraction unit configured to subtract the pseudo noise signal from the input signal; and
a switching unit configured to switch between outputting a first output from the first filter and a second output from the second filter and to output either the first output or the second output, the switching unit outputting the first output from the first filter at a time when the periodicity of the periodic noise changes and during a predetermined time after the time when the periodicity of the periodic noise changes.

2. The signal processing circuit according to claim 1, wherein the switching unit is configured to switch between outputting a first output signal obtained by passing the input signal through the first filter and a second output signal obtained by passing the input signal through the second filter and to output either the first output signal or the second output signal.

3. The signal processing circuit according to claim 1, wherein the switching unit is configured to switch between outputting a first output signal obtained by passing the input signal through the second filter and a second output signal obtained by passing the first output signal through the first filter and to output either the first output signal or the second output signal.

4. The signal processing circuit according to claim 1, wherein the switching unit is configured to output a second output signal from the second filter when the periodicity of the periodic noise is substantially constant.

5. The signal processing circuit according to claim 1, wherein the switching unit is configured to output a second output signal from the second filter when the noise level of the periodicity of the periodic noise is substantially constant.

6. An audio signal processing circuit comprising:
a first filter including,
a counter arranged to receive periodicity information synchronized with periodicity of a periodic noise included in an input audio signal and to convert the periodicity information to delay information,
a variable delaying unit configured to receive the delay information from the counter and to carry out delay processing so as to delay a level adjusted signal supplied thereto by an amount of time determined on the basis of the delay information, and
a filter unit configured to receive the input audio signal, the filter unit having a notch characteristic at a frequency f, the frequency f satisfying f=N/T, where N represents an integer equal to or greater than one and T represents a delaying time applied by the delaying unit,
in which the level adjusted signal is supplied to the variable delaying unit from the filter unit;
a second filter, including
an adaptive filter unit configured to output a pseudo noise signal approximating the periodic noise on the basis of the periodicity information, and
a subtraction unit configured to subtract the pseudo noise signal from the input audio signal; and
a switching unit configured to switch between outputting a first output of the first filter and a second output of the second filter and to output either the first output or the second output, the switching unit outputting the first output from the first filter at a time when the periodicity of the periodic noise changes and during a predetermined time after the time when the periodicity of the periodic noise changes.

7. An imaging apparatus comprising:
an imaging unit configured to capture light from an object and to output an image signal;
an audio pick-up unit configured to pick up sound and output an audio signal;
an audio signal processing unit configured to carry out signal processing on the audio signal output from the audio pick-up unit; and
a recording unit having a rotary mechanism, the recording unit being capable of recording an image signal output from the imaging unit and an audio signal output from the audio signal processing unit onto a recording medium,
wherein the audio signal processing unit includes,
a first filter having,
a counter arranged to receive periodicity information synchronized with periodicity of a periodic noise included in the audio signal output form the audio pick-up unit and to convert the periodicity information to delay information,
a variable delaying unit configured to receive the delay information from the counter and to carry out delay processing so as to delay a level adjusted signal supplied thereto by an amount of time determined on the basis of the delay information, and
a filter unit configured to receive the audio signal output form the audio pick-up unit, the filter unit having a notch characteristic at a frequency f, the frequency f satisfying f=N/T, where N represents an integer equal to or greater than one and T represents a delaying time applied by the delaying unit,
in which the level adjusted signal is supplied to the variable delaying unit from the filter unit;
a second filter having,
an adaptive filter unit configured to output a pseudo noise signal approximating the periodic noise on the basis of the periodicity information, and
a subtraction unit configured to subtract the pseudo noise signal from the audio signal output form the audio pick-up unit, and
a switching unit configured to switch between outputting a first output from the first filter and a second output from the second filter and to output either the first output or the second output, the switching unit outputting the first output from the first filter at a time when the periodicity of the periodic noise changes and during a predetermined time after the time when the periodicity of the periodic noise changes.

8. A recording apparatus comprising:
an audio pick-up unit configured to pick up sound and output an audio signal;
an audio signal processing unit configured to carry out signal processing on the audio signal output from the audio pick-up unit; and
a recording unit having a rotary mechanism, the recording unit being capable of recording an audio signal output from the audio signal processing unit,
wherein the audio signal processing unit includes,
a first filter having,
a counter arranged to receive periodicity information synchronized with periodicity of a periodic noise included in the audio signal output from the audio pick-up unit and to convert the periodicity information to delay information,
a variable delaying unit configured to receive the delay information from the counter and to carry out delay processing so as to delay a level adjusted signal supplied thereto by an amount of time determined on the basis of the delay information, and
a filter unit configured to receive the audio signal output from the audio pick-up unit, the filter unit having a notch characteristic at a frequency f, the frequency f satisfying f=N/T, where N represents an integer equal to or greater than one and T represents a delaying time applied by the delaying unit,
in which the level adjusted signal is supplied to the variable delaying unit from the filter unit, and
a second filter having,
an adaptive filter unit configured to output a pseudo noise signal approximating the periodic noise on the basis of the periodicity information, and
a subtraction unit configured to subtract the pseudo noise signal from the audio signal output from the audio pick-up unit, and
a switching unit configured to switch between outputting a first output from the first filter and a second output from the second filter and to output either the first output or the second output, the switching unit outputting the first output from the first filter at a time when the periodicity of the periodic noise changes and during a predetermined time after the time when the periodicity of the periodic noise changes.

9. A playing apparatus comprising:
a playing unit configured to play an audio signal, the playing unit including a rotary mechanism;
an audio signal processing unit configured to carry out signal processing on the audio signal output from the playing unit; and
an audio output unit configured to output an audio signal output from the signal processing unit,
wherein the audio signal processing unit includes,
a first filter having,
a counter arranged to receive periodicity information synchronized with periodicity of a periodic noise included in the audio signal output from the playing unit and to convert the periodicity information to delay information,
a variable delaying unit configured to receive the delay information from the counter and to carry out delay processing so as to delay a level adjusted signal supplied thereto by an amount of time determined on the basis of the delay information, and
a filter unit configured to receive the audio signal output from the audio playing unit, the filter unit having a notch characteristic at a frequency f, the frequency f satisfying f=N/T, where N represents an integer equal to or greater than one and T represents a delaying time applied by the delaying unit,
in which the level adjusted signal is supplied to the variable delaying unit from the filter unit, and
a second filter having,
an adaptive filter unit configured to output a pseudo noise signal approximating the periodic noise on the basis of the periodicity information, and
a subtraction unit configured to subtract the pseudo noise signal from the audio signal output from the audio playing unit; and
a switching unit configured to switch between outputting a first output from the first filter and a second output from the second filter and to output either the first output or the second output, the switching unit outputting the first output from the first filter at a time when the periodicity of the periodic noise changes and during a predetermined time after the time when the periodicity of the periodic noise changes.

* * * * *